(12) United States Patent
Sekigawa et al.

(10) Patent No.: US 7,423,324 B2
(45) Date of Patent: Sep. 9, 2008

(54) DOUBLE-GATE MOS TRANSISTOR, DOUBLE-GATE CMOS TRANSISTOR, AND METHOD FOR MANUFACTURING THE SAME

(75) Inventors: Toshihiro Sekigawa, Ibaraki (JP); Yongxun Liu, Ibaraki (JP); Meishoku Masahara, Ibaraki (JP); Hanpei Koike, Ibaraki (JP); Eiichi Suzuki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 208 days.

(21) Appl. No.: 11/098,467

(22) Filed: Apr. 5, 2005

(65) Prior Publication Data

US 2005/0224884 A1    Oct. 13, 2005

(30) Foreign Application Priority Data

Apr. 8, 2004    (JP)    ............................. 2004-113707

(51) Int. Cl.
| | |
|---|---|
| *H01L 27/01* | (2006.01) |
| *H01L 27/12* | (2006.01) |
| *H01L 29/00* | (2006.01) |
| *H01L 27/10* | (2006.01) |
| *H01L 29/739* | (2006.01) |
| *H01L 29/73* | (2006.01) |
| *H01L 29/76* | (2006.01) |
| *H01L 29/94* | (2006.01) |
| *H01L 31/113* | (2006.01) |
| *H01L 31/119* | (2006.01) |
| *H01L 31/062* | (2006.01) |

(52) U.S. Cl. ................. 257/347; 257/202; 257/204; 257/206; 257/338; 257/348; 257/349; 257/350; 257/351; 257/352; 257/353; 257/354; 257/357; 257/369; 257/401; 257/507

(58) Field of Classification Search ............ 257/202, 257/204, 206, 338, 357, 369, 401, 347–354, 257/507
See application file for complete search history.

(56) References Cited

U.S. PATENT DOCUMENTS

| 4,488,165 A | * | 12/1984 | Levine ....................... 257/227 |
| 5,177,572 A | * | 1/1993 | Murakami .................. 257/260 |
| RE35,405 E | * | 12/1996 | Murakami et al. .......... 438/637 |

(Continued)

FOREIGN PATENT DOCUMENTS

JP    2002-270850 A    9/2002

(Continued)

*Primary Examiner*—Ida M Soward
(74) *Attorney, Agent, or Firm*—Rader, Fishman & Grauer, PLLC

(57) ABSTRACT

In a double-gate MOS transistor, a substrate, an insulating layer, and a semiconductor layer are formed or laminated in that order, an opening extending to the insulating layer is formed in the semiconductor layer while leaving an island-shaped region, the island-shaped region including a semiconductor crystal layer having a predetermined length and height and a predetermined shape of horizontal section, the semiconductor crystal layer including P-type or N-type source region, channel region, and drain region, in that order, formed therein, a source electrode, gate electrodes, and a drain electrode are provided in contact with side surfaces of the respective regions, and the gate electrodes are provided in contact with the side surfaces of the channel region.

19 Claims, 26 Drawing Sheets

U.S. PATENT DOCUMENTS

| | | | |
|---|---|---|---|
| 6,114,768 A * | 9/2000 | Gaul et al. | 257/777 |
| 6,121,659 A * | 9/2000 | Christensen et al. | 257/347 |
| 6,121,661 A * | 9/2000 | Assaderaghi et al. | 257/355 |
| 6,124,615 A * | 9/2000 | Lee | 257/349 |
| 6,232,649 B1 * | 5/2001 | Lee | 257/588 |
| 6,337,505 B2 * | 1/2002 | Hwang et al. | 257/401 |
| 6,492,244 B1 * | 12/2002 | Christensen et al. | 438/404 |
| 6,528,853 B2 * | 3/2003 | Christensen et al. | 257/353 |
| 6,630,388 B2 | 10/2003 | Sekigawa et al. | |
| 6,667,518 B2 * | 12/2003 | Christensen et al. | 257/350 |
| 6,821,856 B2 * | 11/2004 | Takagi | 438/294 |
| 6,911,383 B2 * | 6/2005 | Doris et al. | 438/588 |
| 7,019,342 B2 * | 3/2006 | Hackler et al. | 257/250 |
| 7,061,055 B2 | 6/2006 | Sekigawa et al. | |

FOREIGN PATENT DOCUMENTS

| | | |
|---|---|---|
| JP | 2003-163356 A | 6/2003 |

* cited by examiner

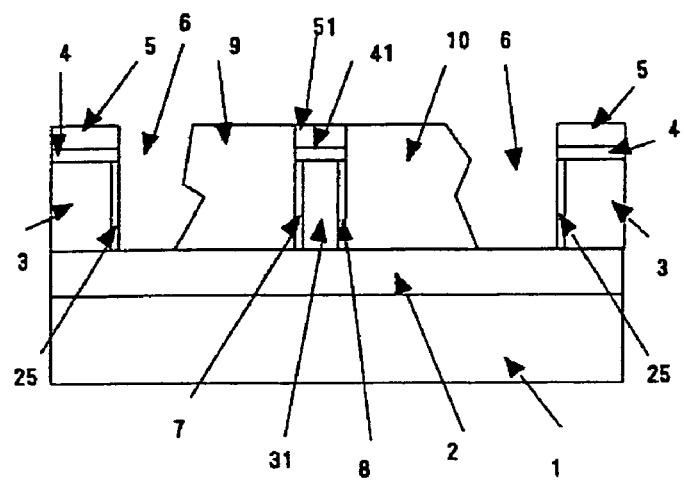
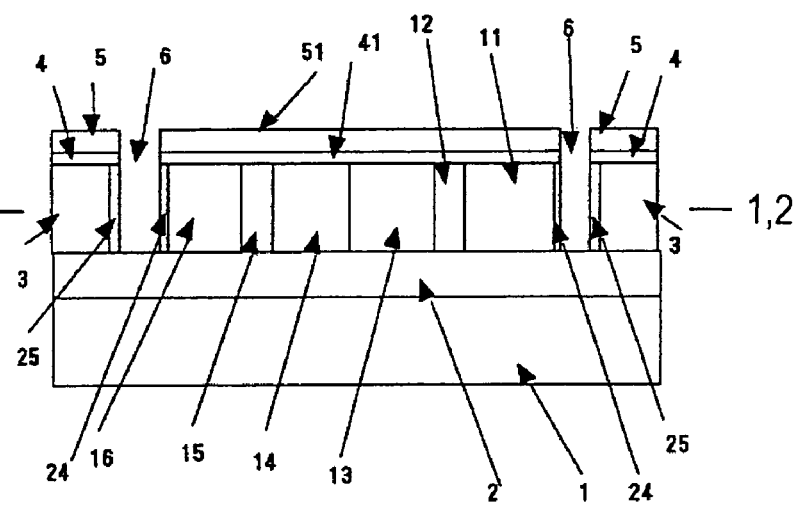
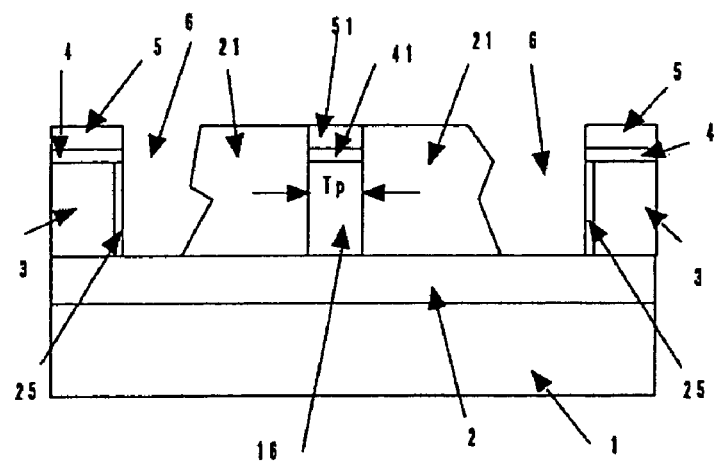

DOUBLE-GATE MOS TRANSISTOR, DOUBLE-GATE CMOS TRANSISTOR, AND METHOD FOR MANUFACTURING THE SAME

TECHNICAL FIELD OF THE INVENTION

The present invention relates to a double-gate MOS transistor, a double-gate CMOS transistor, and a method for manufacturing a double-gate MOS transistor.

DESCRIPTION OF RELATED ART

Japanese Laid Open Patent No. 2002-270850 described that a groove is formed in a semiconductor layer having a predetermined thickness, provided on a substrate via an insulator, the groove having a depth at least extending to the insulator and having a predetermined opening area, and an N-type double-gate MOS transistor structure or a P-type double-gate MOS transistor structure is provided in the groove. Japanese Laid Open Patent No. 2003-163356 discloses that a group of double-gate MOS transistors is provided on a substrate. In these references, it is possible to regard these transistor structures as mutually separated from each other. That is, each of the transistor structures is N-type or P-type, and the transistor structures are separated from each other. Furthermore, these references do not disclose arrangements for providing contact with a source region or a drain region, so that it is assumed that contact is provided from the surface as is conventionally the case.

SUMMARY OF THE INVENTION

In the double-gate MOS transistor structure disclosed in Japanese Laid Open Patent No. 2002-270850 or Japanese Laid Open Patent No. 2003-163356, electrode regions of respective drain regions and source regions composed of semiconductor layers, i.e., electrical contacts therewith (drain contacts and source contacts) are provided on the surface. Thus, the area of the electrode regions, composed of semiconductor layers, must be considerably large relative to the area of the channel region in order to sufficiently reduce contact resistance. As miniaturization of transistor structures progresses, the area of electrode regions is reduced, and contact resistance increases accordingly, causing considerable problems in the functions of elements. This situation can be avoided by increasing the area of electrode regions. However, in the double-gate MOS transistor structure described above, the surface area of the channel region is determined by the product of the thickness of the channel sandwiched by the double gates with respect to the direction of gate electrodes and the length between the source region and the drain region. These factors are usually minimized to the limit of lithography techniques, so that the area of electrode regions increases considerably. This inhibits miniaturization of the area of the transistor structure as a whole.

Furthermore, when an integrated circuit including a double-gate MOS transistor structure is implemented, similarly to the case of an ordinary MOS integrated circuit, a CMOS structure is usually employed to reduce power consumption. However, since in a conventional double-gate MOS transistor structure, N-type and P-type MOS transistor structures are separated from each other, when implementing a CMOS circuit, a wiring process for electrically connecting the respective drain regions to form an output terminal is needed. In the wiring process, electrode regions provided on the respective surfaces are connected by a wiring material, such as metal. Since the area of the electrode regions is large causing increase of the circuit area, decrease in the operation speed of the integrated circuit, increase in manufacturing cost, and so forth.

It is an object of the present invention to provide a double-gate MOS transistor and a double-gate CMOS transistor in which the area of the transistor is reduced while maintaining the contact area of electrode regions in a source region and a drain region, and a method of manufacturing the same.

An N-type double-gate MOS transistor structure or a P-type double-gate MOS transistor structure is provided in a groove provided in a semiconductor crystal layer having a predetermined height and provided via an insulator on a substrate, wherein the groove having a depth extending at least to the insulator and having a predetermined opening area, and a group of island-shaped semiconductor crystal layers, each of which forms a part of the semiconductor crystal layer and has a predetermined length and height and a predetermined shape of horizontal section is provided, at least one of the island-shaped semiconductor crystal layers includes a source region, a channel region, and a drain region formed along a length direction thereof in that order, the height thereof defining a channel width, the two gate electrodes being provided on a common principal surface with the channel region so as to oppose each other across the channel region and electrically insulated from each other, and a source electrode and a drain electrode are provided on side surfaces of the island-shaped semiconductor crystal layer. Furthermore, electrode regions to drain region and source and a source region of the N-type or P-type MOS transistor structure formed in the island-shaped semiconductor crystal layer are provided by self-alignment with the respective gate electrodes (i.e., the positions are simultaneously positioned by a single lithography process).

Also, a semiconductor crystal layer having a predetermined height and insulated from a substrate by an insulator is provided, a groove having a depth extending at least to the insulator and having a predetermined opening area is provided, and a group of island-shaped semiconductor crystal layers, each of which forms part of the semiconductor crystal layer and has a predetermined length, height and a predetermined shape of horizontal section is provided in the groove. As needed, each of the island-shaped semiconductor crystal layers may have such a shape of horizontal cross section that a groove having the same depth as the above-mentioned groove is simultaneously formed therein. Furthermore, at least one pair of N-type double-gate MOS transistor structure and P-type double-gate MOS transistor structure is formed in at least one of the island-shaped semiconductor crystal layers along a length direction thereof, the height thereof defining a channel width, the respective drain regions of the N-type MOS transistor structure and the P-type MOS transistor structure being in contact with each other in the island-shaped semiconductor crystal layer, the respective channel regions and the respective source regions are provided in that order toward the respective ends in respective length directions thereof (the length directions of the N-type and P-type double-gate MOS transistor structures being opposite to each other), the respective double insulated gate electrodes have an N-type double-gate MOS transistor structure and a P-type double-gate MOS transistor structure that are disposed on a common principal surface with the respective channel regions so as to face each other across the channel regions and so as to be electrically insulated from each other, and an electrode region is provided so as to cross the boundary between both drain regions, forming an output terminal, whereby a double-gate CMOS structure is formed. Furthermore, as needed, an N-type or P-type double-gate MOS transistor structure connected in parallel or series with the N-type or P-type double-gate MOS transistor structure in the double-gate CMOS structure is formed in the same island-shaped semiconductor crystal layer. Furthermore, in the other island-shaped semiconductor crystal layers, only N-type double-gate MOS transistor structures or only P-type double-gate MOS transistor structures are formed and used as circuit elements as needed.

Furthermore, in order to alleviate increase in the area of the electrode region, the electrode regions of the drain region and the source region of the N-type or P-type double-gate MOS transistor structure formed in the island-shaped semiconductor crystal layer are provided on side surfaces of the island-shaped semiconductor crystal layer. Furthermore, the electrode regions are provided by self-alignment with the respective gate electrodes (i.e., the positions are simultaneously determined by a single lithography process).

Instead of the group of island-shaped semiconductor crystal layers, a group of semiconductor crystal layers bridging over the groove may be provided, and elements are separated in a subsequent process, thereby forming a group of semiconductor crystal layers separated from the peripheral regions.

More specifically, the following means for solving the problems are employed.

In a double-gate MOS transistor, a substrate, an insulating layer, and a semiconductor layer are formed or laminated in that order, an opening extending to the insulating layer is formed in the semiconductor layer while leaving an island-shaped region, the island-shaped region including a semiconductor crystal layer having a predetermined length and height and a predetermined shape of horizontal section, the semiconductor crystal layer including P-type or N-type source region, channel region, and drain region formed therein in that order, a source electrode, gate electrodes, and a drain electrode are provided in contact with side surfaces of the respective regions, and the gate electrodes are provided in contact with the side surfaces of the channel region.

The double-gate MOS transistor may include a plurality of the P-type double-gate MOS transistors only or N-type double-gate MOS transistors only described above, or a plurality of sets of the P-type double-gate MOS transistor and the N-type double-gate MOS transistor.

When the double-gate MOS transistor includes both the P-type double-gate MOS transistor and the N-type double-gate MOS transistor, these double-gate MOS transistor may be composed of material(s) having the same work function as that of electrodes.

In the double-gate MOS transistor, the source electrode and the drain electrode of the N-type double-gate MOS transistor may be composed of material having a small value of work function, and the source electrode and the drain electrode of the P-type double-gate MOS transistor may be composed of a material having a large value of work function.

In the double-gate MOS transistor, the horizontal shape of the source electrode formed in contact with a side surface of the source region of the P-type double-gate MOS transistor, the gate electrodes formed in contact with side surfaces of the channel region thereof, and the drain electrode formed in contact with a side surface of the drain region thereof, or the horizontal shape of the source electrode formed in contact with a side surface of the source region of the N-type double-gate MOS transistor, gate electrodes formed in contact with side surfaces of the channel region, and the drain electrode formed in contact with a side surface of the drain region, may be defined by a single patterning on a surface along a horizontal surface of the opening of the groove.

In the above-mentioned double-gate MOS transistor, the horizontal shape of the source electrode formed in contact with a side surface of the source region of the P-type double-gate MOS transistor, the gate electrodes formed in contact with side surfaces of the channel region thereof, the drain electrode formed in contact with a side surface of the drain region thereof, the source electrode formed in contact with a side surface of the source region of the N-type double-gate MOS transistor, the gate electrodes formed in contact with side surfaces of the channel region, and the drain electrode formed in contact with a side surface of the drain region, may be defined by a single patterning on a surface along a horizontal surface of the opening of the groove.

In a double-gate CMOS transistor, the source region, the channel region, and the drain region of the P-type double-gate MOS transistor and the source region, the channel region, and the drain region of the N-type double-gate MOS transistor are, in that order, provided in the semiconductor crystal layer of the island-shaped region along a length direction thereof, and the drain regions of the N-type double-gate MOS transistor and the P-type double-gate MOS transistor are provided in contact with each other in middle part of the semiconductor crystal layer of the island-shaped region.

In the above-mentioned double-gate CMOS transistor, the drain electrodes and the source electrodes may be provided in contact with side surfaces of the source region and the drain region in the island-shaped semiconductor crystal layer.

In the above-mentioned double-gate CMOS transistor, a plurality of the double-gate CMOS transistors may be provided in a groove having an opening formed by an insulating layer.

In the double-gate CMOS transistor, the gate electrodes of the N-type and P-type double-gate MOS transistors may all be composed of materials having the same work function.

In the above-mentioned double-gate CMOS transistor, one or more double-gate MOS transistors described above may also be provided in the opening.

In the above-mentioned double-gate CMOS transistor, the source electrode and the drain electrode of the N-type double-gate MOS transistor may be composed of a material having a small value of work function, and the source electrode and the drain electrode of the P-type double-gate MOS transistor may be composed of a material having a large value of work function.

In the above-mentioned double-gate CMOS transistor, the horizontal shapes of the source electrode formed in contact with a side surface of the source region of the P-type double-gate MOS transistor, the gate electrodes formed in contact with side surfaces of the channel region thereof, the drain electrode formed in contact with a side surface of the drain region thereof, the source electrode formed in contact with a side surface of the source region of the N-type double-gate MOS transistor, the gate electrodes formed in contact with side surfaces of the channel region, and the drain electrode formed in contact with a side surface of the drain region, may be defined by a single patterning on a surface along a horizontal surface of the opening of the groove.

A method of manufacturing a double-gate MOS transistor includes a step of forming a semiconductor crystal layer having a predetermined height via an insulator on a substrate, and providing at least one pair of heavily doped impurity regions in the semiconductor crystal layer in parallel to a surface of the substrate, the pair of heavily doped impurity regions including a first heavily doped impurity region having a P-type region or an N-type region with a depth extending to the insulator and a second heavily doped impurity region separated from the first heavily doped impurity region by a predetermined distance by a semiconductor region and having the same conductive type as the first heavily doped impurity region; a step of laminating an etching mask on a surface of the semiconductor crystal layer; a step of forming the semiconductor region of the semiconductor crystal layer into an island shape so that respective ends thereof are located in each of the regions of the pair of heavily doped impurity regions and so that the intervening semiconductor region has a predetermined channel thickness, and forming a groove extending to the insulator so that side surfaces of the island-shaped region are exposed to the groove; a step of forming oxide films on the side surfaces of the semiconductor crystal layer exposed to the groove; a step of filling the groove with polycrystalline silicon and performing flattening; a step of patterning the island-shaped semiconductor crystal layer by mask material having a planar shape including a drain electrode region located on one end, a source electrode region located on the other end, and gate electrode regions intervening these electrode regions and having a predetermined gap, removing the polycrystalline silicon to form a group of island-shaped polycrystalline silicon layers, then removing the oxide films on the side surfaces of the island-shaped semiconductor crystal layer, introducing highly concentrated impurities of the same conductive type as the pair of heavily doped impurity regions into the island-shaped semiconductor crystal layer from the side surfaces thereof, and filling the groove with a silicon oxide film and performing flattening; a step of removing island-shaped polycrystalline silicon layers of the gate electrode regions among the island-shaped polycrystalline silicon layers to form a second set of grooves having depths extending to the surface of the insulator, exposing the side surfaces of the island-shaped semiconductor crystal layer, and filling the grooves with gate electrode material and performing flattening; and a step of removing island-shaped polycrystalline silicon layers of the drain electrode region and the source electrode region among the island-shaped polycrystalline silicon layers to form a third group of grooves having depths extending to the surface of the insulator, exposing the side surfaces of the island-shaped semiconductor crystal layer, removing the oxide films on the side surfaces of the island-shaped semiconductor crystal layer, and filling the grooves with drain and source electrode materials and performing flattening.

In the above-mentioned method of manufacturing a double-gate MOS transistor, the oxide films may be removed from the side surfaces of the P-type gate region of the island-shaped semiconductor crystal region alone, the N-type gate region of the island-shaped semiconductor layer alone, or both the N-type and P-type gate regions of the island-shaped semiconductor layer, then etching the side surfaces of the island-shaped semiconductor crystal layer so that the width thereof is decreased to a predetermined thickness, then forming gate oxide films, and filling the groove with gate electrode material and performing flattening.

In the method of manufacturing a double-gate MOS transistor, after filling in the gate electrode material and the drain and source electrode materials, flattening may be performed simultaneously to form the gates, drain, and source separately.

A method of manufacturing a double-gate CMOS transistor includes a step of forming a semiconductor crystal layer having a predetermined height via an insulator on a substrate, providing a pair of heavily doped impurity region in the semiconductor crystal layer in parallel to a surface of the substrate, the heavily doped impurity region including a source region having a P-type region with a depth extending to the insulator, and a drain region separated from the source region by a predetermined distance by a semiconductor region and having the same conductive type as the source region, and providing a pair of heavily doped impurity region in the semiconductor crystal layer in parallel to the surface of the substrate, the heavily doped impurity region including a source region having an N-type region with a depth extending to the insulator and a drain region separated from the source region by a predetermined distance by a semiconductor region and having the same conductive type as the source region, the drain region of the P-type and the drain region of the N-type being in contact with each other; a step of laminating an etching mask on a surface of the semiconductor crystal layer; a step of forming the semiconductor regions of the semiconductor crystal layer into island shapes so that respective ends thereof are located in the respective regions of the pairs of heavily doped impurity regions, so that the boundary between the P-type drain region and the N-type drain region is at least partially located in a middle region, and so that the respective intervening semiconductor regions between the source regions and the drain regions have a predetermined channel thickness, and forming a groove extending to the insulator so that side surfaces of the island-shaped region are exposed to the groove; a step of forming oxide films on the side surfaces of the semiconductor crystal layer exposed to the groove; a step of filling the groove with polycrystalline silicon and performing flattening; a step of patterning the island-shaped semiconductor crystal layer by mask material having a planar shape including source electrode regions located on the respective ends, drain electrode regions separated by the predetermined gaps by the semiconductor regions, and gate electrode regions intervening these electrode regions and having predetermined gaps, removing polycrystalline silicon to form a group of island-shaped polycrystalline silicon layers, and filling the groove with a silicon oxide film and performing flattening; a step of removing the silicon oxide layer between the P-type source electrode region and drain electrode region to expose side surfaces of the island-shaped semiconductor layer to the groove, removing the oxide films on the side surfaces of the island-shaped semiconductor crystal layer, and introducing highly concentrated impurities of the same conductive type as the pair of heavily doped impurity regions into the island-shaped semiconductor crystal layer from the side surfaces thereof, and filling the groove with a silicon oxide film; a step of removing the silicon oxide layer between the N-type source electrode region and drain electrode region to expose side surfaces of the island-shaped semiconductor layer to the groove, removing the oxide films on side surfaces of the island-shaped semiconductor crystal layer, and introducing highly concentrated impurities of the same conductive type as the pair of heavily doped impurity regions into the island-shaped semiconductor crystal layer from the side surfaces thereof, and filling the groove with a silicon oxide film and performing flattening; removing island-shaped polycrystalline silicon layers of ones of the gate electrodes associated with one conductive type among the island-shaped polycrystalline silicon layer to form a second group of grooves having depths extending to the surface of the insulator, exposing the side surfaces of the island-shaped semiconductor crystal layer, and filling the grooves with gate electrode material and performing flattening; removing island-shaped polycrystalline silicon layers of other ones of the gate electrodes associated with the other conductive type among the island-shaped polycrystalline silicon layer to form a third group of grooves having depths extending to the surface of the insulator, exposing the side surfaces of the island-shaped semiconductor crystal layer, and filling the grooves with the gate electrode material and performing flattening; removing island-shaped polycrystalline silicon layers of the drain electrodes and the source electrodes among the island-shaped polycrystalline silicon layer to form a fourth group of grooves having depths extending to the surface of the insulator, exposing the side surfaces of the island-shaped semiconductor crystal layer, removing the oxide films on the side surfaces of the semiconductor crystal layer, and filling the grooves with drain and source electrode materials and performing flattening.

In the method of manufacturing a double-gate CMOS transistor, the second and third groups of grooves having depths extending to the surface of the insulator may be simultaneously formed by removing the island-shaped polycrystalline silicon layers of the respective gate electrodes, exposing the side surfaces of the island-shaped semiconductor crystal layer, and filling the grooves with the gate electrode material and performing flattening.

In the method of manufacturing a double-gate CMOS transistor, the grooves formed by removing the island-shaped polycrystalline silicon layer of the P-type drain electrode region and the island-shaped polycrystalline silicon layer of the P-type source electrode region may be filled with source electrode material and drain electrode material having a large value of work function, and the grooves formed by removing the island-shaped polycrystalline silicon layer of the N-type drain electrode region and the island-shaped polycrystalline silicon layer of the N-type source electrode region may be filled with source electrode material and drain electrode material having a small value of work function.

In the method of manufacturing a double-gate CMOS transistor, the oxide film may be removed from the side surfaces of the P-type gate region of the island-shaped semiconductor layer alone, the N-type gate region of the island-shaped semiconductor layer alone, or both the N-type and P-type gate regions of the semiconductor crystal layer, etching the side surfaces of the island-shaped semiconductor layer so that the width thereof is reduced to a predetermined thickness, and filling the grooves with the gate electrode material and performing flattening.

In the method of manufacturing a double-gate CMOS transistor, after filling the gate electrode material and the drain and source electrode materials, flattening may be performed simultaneously to form the respective regions separately.

Advantages of forming the respective electrode regions according to the present invention on a side surface of the island-shaped semiconductor crystal layer will be described.

Hereinafter, the height of the island-shaped semiconductor crystal layer be denoted by H, the lateral thickness of the electrode regions by T, the circumferential length of a region needed to provide contact by L, and an area needed for the electrode regions to achieve a desired sufficiently small contact resistance by S. When contact is provided from the above as is usually the case, the necessary planar area of the electrode regions is S. However, when contact is provided from the side surfaces, L=S/H. Furthermore, since the side surface and end surfaces can be used to provide contact, the needed length of the side surfaces is (L−T)/2. In this case, the planar area S' of the electrode regions is S'=T*(L−T)/2. This value can be reduced as desired by decreasing the value of T, indicating that it is readily possible to achieve S'<<S. That is, advantageously, the planar area of the electrode regions can be considerably smaller than usual.

In a CMOS structure according to the present invention, a pair of N-type double-gate MOS transistor structure and P-type double-gate MOS transistor structure are provided in a single island-shaped semiconductor crystal layer so that respective drain regions thereof are in contact with each other.

Thus, the device area can be reduced compared with a case when the elements are provided separately. Furthermore, since the respective electrode regions are provided on side surfaces of the semiconductor crystal layer, the element area of one layer can be further reduced. As will be described in relation to an example of manufacturing stepes, the respective gate electrodes composed of metal or silicide, and the drain electrodes electrically connected to each other to form output electrodes and the source electrodes can be formed by self-alignment on the side surfaces of the island-shaped semiconductor crystal layer. Thus, the device area can be further reduced, allowing a denser circuit structure. Furthermore, the self-alignment serves to considerably reduce variation in the distances between the respective electrodes depending on manufacturing stepes. This serves to reduce variation in circuit operation. Furthermore, wiring in the first layer (on the insulating film insulating the semiconductor crystal layer from the substrate in the groove) may be composed of various metals, various suicides, or composite material forming multi-layer thereof. Thus, stray capacitance can be reduced and miniaturization is allowed compared with conventional wiring by heavily doped semiconductor layers. This allows further reduction in circuit area and increase in the speed of circuit operation.

Furthermore, by forming the double-gate transistor structure in the groove, regions of the semiconductor crystal layer in the peripheries of the laminated or formed etching mask remain, and the regions function as an etching mask in a flattening process, such as chemical mechanical polishing (CMP). This serves to achieve a smooth surface. Furthermore, when only element regions exist on the substrate, particularly in a fin-structure double-gate MOS transistor structure disclosed in Japanese Laid Open Patent No. 2002-270850 or Japanese Laid Open Patent No. 2003-163356, the element regions could be corrupted or deformed by a flattening process. However, by using the peripheral regions of the groove as an etching mask, this problem can be alleviated.

Now, the advantages of the present invention will be described in detail.

Since in a double-gate MOS transistor according to the presentation, a substrate, an insulating layer, and a semiconductor layer are formed or laminated in that order, an opening extending to the insulating layer is formed in the semiconductor layer while leaving an island-shaped region, the island-shaped region including a semiconductor crystal layer having a predetermined length and height and a predetermined shape of horizontal section, the semiconductor crystal layer including P-type or N-type source region, channel region, and drain region, in that order, formed therein, a source electrode, gate electrodes, and a drain electrode are provided in contact with side surfaces of the respective regions, and the gate electrodes are provided in contact with the side surfaces of the channel region, although the flexibility of wiring is conventionally limited, for example, wiring is possible only within the same semiconductor diffusion region or application to long wiring is inhibited due to large resistance, electrodes are provided on side surfaces so that the planar area for the electrodes is reduced, so that the planar area for a double-gate MOS transistor can be reduced. Furthermore, wiring by metal in an opening, i.e., on the same surface as that where the double-gate MOS transistor is provided, is allowed.

Further, the double-gate MOS transistor may include a plurality of the P-type double-gate MOS transistors only or N-type double-gate MOS transistors only described above, or a plurality of sets of the P-type double-gate MOS transistor and the N-type double-gate MOS transistor. In such a case, a circuit including a double-gate MOS transistor can be provided in an opening, allowing connection by metallic wiring in the opening.

When the double-gate MOS transistor includes both the P-type double-gate MOS transistor and the N-type double-gate MOS transistor, these double-gate MOS transistor may be composed of material(s) having the same work function as that of electrodes, the gate electrodes of the P-type double-gate MOS transistor and the N-type double-gate MOS transistor can be formed by a single process. This allows simplification of manufacturing stepes.

Furthermore, in the double-gate MOS transistor, the source electrode and the drain electrode of the N-type double-gate MOS transistor may be composed of material having a small value of work function, and the source electrode and the drain electrode of the P-type double-gate MOS transistor may be composed of a material having a large value of work function. In such a case, the contact resistance between a source region and a drain region composed of semiconductor crystal can be reduced, allowing further reduction in the area of a double-gate MOS transistor. Thus, stray capacitance is reduced, allowing operation at a higher speed and increase in integration density.

In the double-gate MOS transistor, the horizontal shape of the source electrode formed in contact with a side surface of the source region of the P-type double-gate MOS transistor, the gate electrodes formed in contact with side surfaces of the channel region thereof, and the drain electrode formed in contact with a side surface of the drain region thereof, or the horizontal shape of the source electrode formed in contact with a side surface of the source region of the N-type double-gate MOS transistor, gate electrodes formed in contact with side surfaces of the channel region, and the drain electrode formed in contact with a side surface of the drain region, may be defined by a single patterning on a surface along a horizontal surface of the opening of the groove. In such a case, in contrast to the conventional art in which the relative positions of respective electrodes are determined by separate patterns, the relative positions of respective electrodes are determined by a single pattern. Thus, positioning margins among the patterns, which are needed in the conventional art, are not needed, allowing reduction in the area of a double-gate MOS transistor. Furthermore, a pattern according to the present invention can be determined so as to including wiring pattern in the opening. This serves to reduce the area needed for circuitry.

In the double-gate MOS transistor, the horizontal shape of the source electrode formed in contact with a side surface of the source region of the P-type double-gate MOS transistor, the gate electrodes formed in contact with side surfaces of the channel region thereof, the drain electrode formed in contact with a side surface of the drain region thereof, the source electrode formed in contact with a side surface of the source region of the N-type double-gate MOS transistor, the gate electrodes formed in contact with side surfaces of the channel region, and the drain electrode formed in contact with a side surface of the drain region, may be defined by a patterning on a surface along a horizontal surface of the opening of the groove. In such a case, in contrast to the conventional art in which the relative positions of respective electrodes are determined by separate patterns, the relative positions of respective electrodes are determined by a pattern. Thus, positioning margins among the patterns, which are needed in the conventional art, are not needed, allowing reduction in the area of a double-gate MOS transistor. Furthermore, a pattern according to the present invention can be determined so as to include wiring pattern in the opening. This serves to reduce the area needed for circuitry.

In a double-gate CMOS transistor, the source region, the channel region, and the drain region of the P-type double-gate MOS transistor and the source region, the channel region, and the drain region of the N-type double-gate MOS transistor are, in that order, provided in the semiconductor crystal layer of the island-shaped region along a length direction thereof, and the drain regions of the N-type double-gate MOS transistor and the P-type double-gate MOS transistor are provided in contact with each other in the middle part of the semiconductor crystal layer of the island-shaped region. In such a case, compared with the conventional art in which a P-type double-gate MOS transistor and an N-type double-gate MOS transistor are separated, wiring for connecting the respective drain regions is not needed. This allows reduction in the size of a double-gate CMOS transistor.

In the double-gate CMOS transistor, the drain electrodes and the source electrodes may be provided in contact with side surfaces of the source region and the drain region in the island-shaped semiconductor crystal layer. In such a case, although the flexibility of wiring is conventionally limited, for example, wiring is possible only within the same semiconductor diffusion region or application to long wiring is inhibited due to large resistance, electrodes are provided on side surfaces so that the planar area for the electrodes is reduced, so that the planar area for a double-gate CMOS transistor can be reduced. Furthermore, wiring by metal in an opening, i.e., on the same surface as that where the double-gate CMOS transistor is provided, is allowed.

In the double-gate CMOS transistor, a plurality of the double-gate CMOS transistors may be provided in a groove having an opening formed by an insulating layer. In such a case, a circuit including a double-gate MOS transistor can be provided in an opening, allowing connection by metallic wiring in the opening, i.e., on the same surface as that where the double-gate CMOS transistor is provided.

In the double-gate CMOS transistor, the gate electrodes of the N-type and P-type double-gate MOS transistors may all be composed of materials having the same work function. In such a case, the gate electrodes of the P-type double-gate MOS transistor and the N-type double-gate MOS transistor can be formed by a single process. This allows simplification of manufacturing stepes.

In the double-gate CMOS transistor, one or more double-gate MOS transistors described earlier may also be provided in the opening. In such a case, various circuits can be implemented by providing double-gate CMOS transistors and N-type and P-type double-gate MOS transistors in the opening.

In the double-gate CMOS transistor, the source electrode and the drain electrode of the N-type double-gate MOS transistor may be composed of a material having a small value of work function, and the source electrode and the drain electrode of the P-type double-gate MOS transistor may be composed of a material having a large value of work function. In such a case, the contact resistance between a source region and a drain region composed of semiconductor crystal can be reduced, allowing further reduction in the area of a double-gate CMOS transistor. Thus, stray capacitance is reduced, allowing operation at a higher speed and increase in integration density.

In the double-gate CMOS transistor, the horizontal shapes of the source electrode formed in contact with a side surface of the source region of the P-type double-gate MOS transistor, the gate electrodes formed in contact with side surfaces of the channel region thereof, the drain electrode formed in contact with a side surface of the drain region thereof, the source electrode formed in contact with a side surface of the source region of the N-type double-gate MOS transistor, the gate electrodes formed in contact with side surfaces of the channel region, and the drain electrode formed in contact with a side surface of the drain region, may be defined by a single patterning on a surface along a horizontal surface of the opening of the groove. In such a case, in contrast to the conventional art in which the relative positions of respective electrodes in the present invention are determined by separate patterns, the relative positions of respective electrodes are determined by a single pattern. Thus, positioning margins among the patterns, which are needed in the conventional art, are not needed, allowing reduction in the area of a double-gate CMOS transistor. Furthermore, a pattern according to the present invention can be determined so as to include wiring pattern in the opening. This serves to reduce the area needed for circuitry.

A method of manufacturing a double-gate MOS transistor includes a step of forming a semiconductor crystal layer having a predetermined height via an insulator on a substrate, and providing at least one pair of heavily doped impurity regions in the semiconductor crystal layer in parallel to a surface of the substrate, the pair of heavily doped impurity regions including a first heavily doped impurity region having a P-type region or an N-type region with a depth extending to the insulator and a second heavily doped impurity region separated from the first heavily doped impurity region by a predetermined distance by a semiconductor region and having the same conductive type as the first heavily doped impurity region; a step of laminating an etching mask on a surface of the semiconductor crystal layer; a step of forming the semiconductor region of the semiconductor crystal layer into an island shape so that respective ends thereof are located in the respective regions of the pair of heavily doped impurity regions and so that the intervening semiconductor region has a predetermined channel thickness, and forming a groove extending to the insulator so that side surfaces of the island-shaped region are exposed to the groove; a step of forming oxide films on the side surfaces of the semiconductor crystal layer exposed to the groove; a step of filling the groove with polycrystalline silicon and performing flattening; a step of patterning the island-shaped semiconductor crystal layer by mask material having a planar shape including a drain electrode region located on one end, a source electrode region located on the other end, and gate electrode regions intervening these electrode regions and having a predetermined gap, removing polycrystalline silicon to form a set of island-shaped polycrystalline silicon layers, then removing the oxide films on the side surfaces of the island-shaped semiconductor crystal layer, introducing highly concentrated impurities of the same conductive type as the pair of heavily doped impurity regions into the island-shaped semiconductor crystal layer from the side surfaces thereof, and filling the groove with a silicon oxide film and performing flattening; a step of removing island-shaped polycrystalline silicon layers of the gate electrode regions among the island-shaped polycrystalline silicon layers to form a second set of grooves having depths extending to the surface of the insulator, exposing the side surfaces of the island-shaped semiconductor crystal layer, and filling the grooves with gate electrode material and performing flattening; and a step of removing island-shaped polycrystalline silicon layers of the drain electrode region and the source electrode region among the island-shaped polycrystalline silicon layers to form a third set of grooves having depths extending to the surface of the insulator, exposing the side surfaces of the island-shaped semiconductor crystal layer, removing the oxide films on the side surfaces of the island-shaped semiconductor crystal layer, and filling the grooves with drain and source electrode materials and performing flattening. In such a case, by providing a double-gate MOS transistor in a groove, considerable deformation or corruption thereof in a flattening process is prevented. Furthermore, the positions of respective electrodes can be determined by a single pattern, allowing simplification of manufacturing stepes and reduction in the area thereof. Furthermore, the source electrode and the drain electrode can be formed on side surfaces, allowing reduction in the planar area thereof.

In the method of manufacturing a double-gate MOS transistor, the oxide films may be removed from the side surfaces of the P-type gate region of the island-shaped semiconductor crystal region alone, the N-type gate region of the island-shaped semiconductor layer alone, or both the N-type and P-type gate regions of the island-shaped semiconductor layer, then etching the side surfaces of the island-shaped semiconductor crystal layer so that the width thereof is decreased to a predetermined thickness, then forming gate oxide films, and filling the groove with gate electrode material and performing flattening. In such a case, by decreasing the thickness of the channel region, the effect of a short channel can be suppressed more considerably. That is, a double-gate MOS transistor having a shorter channel length can be used as an integrated circuit element.

In the method of manufacturing a double-gate MOS transistor, after filling in the gate electrode material and the drain and source electrode materials, flattening may be performed simultaneously to form the gates, drain, and source separately. In such a case, instead of filling in different electrode materials and performing flattening, desired materials are sequentially filled in and flattening is performed simultaneously, so that electrodes can be formed by a single process, serving to simplify manufacturing stepes. Furthermore, although electrode materials are sequentially formed or laminated outside the groove and on an etching mask on the double-gate MOS transistor, by performing flattening using the etching mask, electrode materials on regions other than those of the electrodes are simultaneously removed. Thus, the electrodes can be formed by a single process, serving to simplify manufacturing stepes.

A method of manufacturing a double-gate CMOS transistor includes a step of forming a semiconductor crystal layer having a predetermined height via an insulator on a substrate, providing a pair of heavily doped impurity region in the semiconductor crystal layer in parallel to a surface of the substrate, the heavily doped impurity region including a source region having a P-type region with a depth extending to the insulator and a drain region separated from the source region by a predetermined distance by a semiconductor region and having the same conductive type as the source region, and providing a pair of heavily doped impurity region in the semiconductor crystal layer in parallel to the surface of the substrate, the heavily doped impurity region including a source region having an N-type region with a depth extending to the insulator and a drain region separated from the source region by a predetermined distance by a semiconductor region and having the same conductive type as the source region, the drain region of the P-type and the drain region of the N-type being in contact with each other; a step of laminating an etching mask on a surface of the semiconductor crystal layer; a step of forming the semiconductor regions of the semiconductor crystal layer into island shapes so that respective ends thereof are located in the respective regions of the pairs of heavily doped impurity regions, so that the boundary between the P-type drain region and the N-type drain region is at least partially located in a middle region, and so that the respective intervening semiconductor regions between the source regions and the drain regions have a predetermined channel thickness, and forming a groove extending to the insulator so that side surfaces of the island-shaped region are exposed to the groove; a step of forming oxide films on the side surfaces of the semiconductor crystal layer exposed to the groove; a step of filling the groove with polycrystalline silicon and performing flattening; a step of patterning the island-shaped semiconductor crystal layer by mask material having a planar shape including source electrode regions located on the respective ends, drain electrode regions separated by the predetermined gaps by the semiconductor regions, and gate electrode regions intervening these electrode regions and having predetermined gaps, removing polycrystalline silicon to form a set of island-shaped polycrystalline silicon layers, and filling the groove with a silicon oxide film and performing flattening; a step of removing the silicon oxide layer between the P-type source electrode region and drain electrode region to expose side surfaces of the island-shaped semiconductor layer to the groove, removing the oxide films on the side surfaces of the island-shaped semiconductor crystal layer, and introducing highly concentrated impurities of the same conductive type as the pair of heavily doped impurity regions into the island-shaped semiconductor crystal layer from the side surfaces thereof, and filling the groove with a silicon oxide film; a step of removing the silicon oxide layer between the N-type source electrode region and drain electrode region to expose side surfaces of the island-shaped semiconductor layer to the groove, removing the oxide films on side surfaces of the island-shaped semiconductor crystal layer, and introducing highly concentrated impurities of the same conductive type as the pair of heavily doped impurity regions into the island-shaped semiconductor crystal layer from the side surfaces thereof, and filling the groove with a silicon oxide film and performing flattening; removing island-shaped polycrystalline silicon layers of the gate electrodes associated with one conductive type among the island-shaped polycrystalline silicon layer to form a second set of grooves having depths extending to the surface of the insulator, exposing the side surfaces of the island-shaped semiconductor crystal layer, and filling the grooves with gate electrode material and performing flattening; removing island-shaped polycrystalline silicon layers of the gate electrodes associated with the other conductive type among the island-shaped polycrystalline silicon layer to form a third set of grooves having depths extending to the surface of the insulator, exposing the side surfaces of the island-shaped semiconductor crystal layer, and filling the grooves with the gate electrode material and performing flattening; removing island-shaped polycrystalline silicon layers of the drain electrodes and the source electrodes among the island-shaped polycrystalline silicon layer to form a fourth set of grooves having depths extending to the surface of the insulator, exposing the side surfaces of the island-shaped semiconductor crystal layer, removing the oxide films on the side surfaces of the semiconductor crystal layer, and filling the grooves with drain and source electrode materials and performing flattening. In such a case, by providing a double-gate CMOS transistor in a groove, considerable deformation or corruption thereof in a flattening process is prevented. Furthermore, since the respective drain regions of the P-type double-gate MOS transistor and the N-type double-gate MOS transistor are provided in contact with each other, the length of wiring between the drain regions can be minimized. Furthermore, the positions of respective electrodes can be determined by a single pattern, allowing simplification of manufacturing stepes and reduction in the area of the double-gate CMOS transistor. Furthermore, the source electrode and the drain electrode can be formed on side surfaces, allowing reduction in the planar area thereof.

In the method of manufacturing a double-gate CMOS transistor, the second and third sets of grooves having depths extending to the surface of the insulator may be simultaneously formed by removing the island-shaped polycrystalline silicon layers of the respective gate electrodes, exposing the side surfaces of the island-shaped semiconductor crystal layer, and filling the grooves with the gate electrode material and performing flattening. In such a case, single gate electrode material suffices, so that manufacturing stepes can be simplified.

In the method of manufacturing a double-gate CMOS transistor, the grooves formed by removing the island-shaped polycrystalline silicon layer of the P-type drain electrode region and the island-shaped polycrystalline silicon layer of the P-type source electrode region may be filled with source electrode material and drain electrode material having a large value of work function, and the grooves formed by removing the island-shaped polycrystalline silicon layer of the N-type drain electrode region and the island-shaped polycrystalline silicon layer of the N-type source electrode region may be filled with source electrode material and drain electrode material having a small value of work function. In such a case, the contact resistance between the source and drain regions can be reduced, allowing miniaturization of electrode regions.

In the method of manufacturing a double-gate CMOS transistor, the oxide film may be removed from the side surfaces of the P-type gate region of the island-shaped semiconductor layer alone, the N-type gate region of the island-shaped semiconductor layer alone, or both the N-type and P-type gate regions of the semiconductor crystal layer, etching the side surfaces of the island-shaped semiconductor layer so that the width thereof is reduced to a predetermined thickness, and filling the grooves with the gate electrode material and performing flattening. In such a case, a double-gate CMOS transistor in which the effect of a short channel is more considerably suppressed can be implemented. Furthermore, the thicknesses of the source region and the drain region other than the gate regions can be chosen to be a predetermined thickness so that stray resistance in the source region and the drain region is reduced. Thus, a double-gate CMOS transistor in which stray resistance is small and in which the effect of a short channel is more considerably suppressed can be implemented.

In the method of manufacturing a double-gate CMOS transistor, after filling the gate electrode material and the drain and source electrode materials, flattening may be performed simultaneously to form the respective regions separately. In such a case, instead of filling in different electrode materials and performing flattening, desired materials are sequentially filled in and flattening is performed simultaneously, so that electrodes can be formed by a single process, serving to simplify manufacturing stepes. Furthermore, although electrode materials are sequentially formed or laminated outside the groove and on an etching mask on the double-gate CMOS transistor, by performing flattening using the etching mask, electrode materials on regions other than the electrodes are simultaneously removed. Thus, the electrodes can be formed by a single process, serving to simplify manufacturing stepes.

The following examples are given as a particular embodiment of the invention and to demonstrate the practice and advantages thereof. It is understood that the example is give by way of illustration and is not intended to limit the specification or the claims to follow in any manner.

DESCRIPTION OF THE DRAWINGS

The present inventions will now be described by way of example with reference to the following Figures, in which:

FIG. 3A is a cross-sectional view of a double CMOS structure taken along Line 3A-3A shown in FIGS. 1 and 2;

FIG. 3B is a cross-sectional view thereof taken along Line 3B-3B;

FIG. 3C is a cross-sectional view thereof taken along Line 3C-3C;

DETAILED DESCRIPTION OF THE INVENTION

Now, embodiments of the present invention will be described in detail in the context of examples of a double-gate CMOS structure including an N-type double-gate MOS transistor structure and a P-type double-gate MOS transistor structure, with reference to the drawings. An independent N-type double-gate MOS transistor structure or P-type double-gate MOS transistor structure can be implemented by omitting the other type of the MOS transistor structure.

Figure 1:
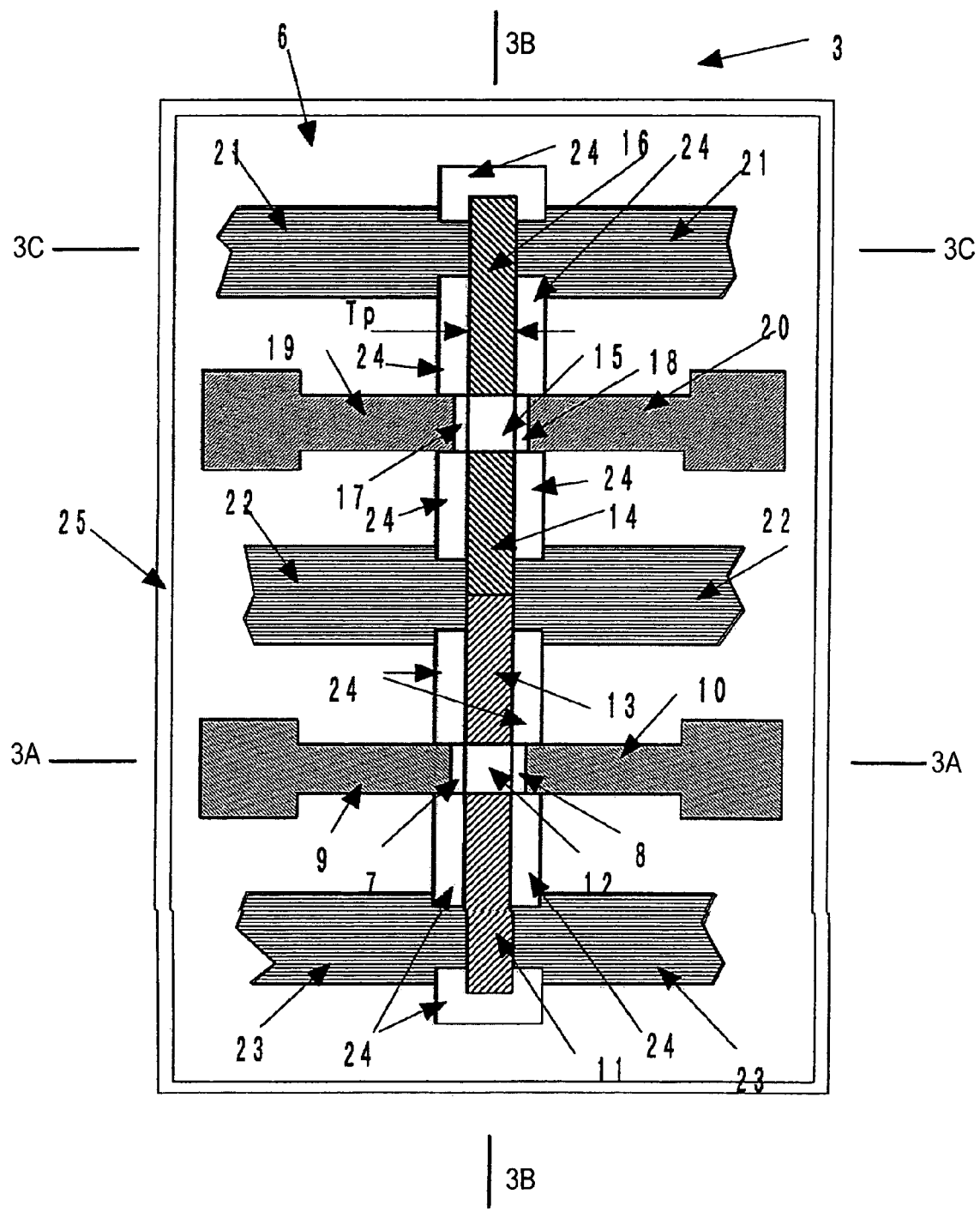
FIG. 1 is a horizontal section of a double-gate CMOS structure according to an embodiment of the present invention.

FIG. 1 is a horizontal section of a double-gate CMOS structure according to an embodiment of the present invention. In the figure, a semiconductor crystal layer 3 (usually a silicon crystal layer) is separated from a substrate by an insulating film and having a predetermined height. A groove is formed in the semiconductor crystal layer 3, having a depth at least extending to the surface of the insulating film on the substrate. Tp denotes the thickness of an island-shaped semiconductor crystal layer formed in the groove 6 (the island-shaped semiconductor crystal layer refers to a semiconductor crystal region that is formed by forming or laminating a substrate, an insulating layer, and a semiconductor layer in that order, and forming a groove extending to the insulating layer while leaving an island-shaped region of the semiconductor layer, the island-shaped region in the groove including at least one set of source region, channel region, and drain region), particularly the thickness of the region of the P-type double-gate MOS transistor structure. 7 denotes a first gate insulating film of the N-type double-gate MOS transistor structure, 8 denotes a second gate insulating film thereof, 9 denotes a first gate electrode thereof, 10 denotes a second gate electrode thereof, 11 denotes a source region thereof, 12 denotes a channel region thereof, and 13 denotes a drain region thereof. 14 denotes a drain region of the P-type double-gate MOS transistor structure, 15 denotes a channel region thereof, 16 denotes a source region thereof, 17 denotes a first gate insulating film thereof, 18 denotes a second gate insulating film thereof, 19 denotes a first gate electrode thereof, and 20 denotes a second gate electrode thereof. As shown in the figure, the drain region 13 of the N-type double-gate MOS transistor structure and the drain region 14 of the P-type double-gate MOS transistor structure are in contact with each other. 21 denotes a source electrode of the P-type double-gate MOS transistor structure. 22 denotes a common drain electrode of the P-type double-gate MOS transistor structure and the N-type double-gate MOS transistor structure. 23 denotes a source electrode of the N-type double-gate MOS transistor structure. These electrodes are connected to electrode regions provided on side surfaces of the respective regions. The electrode region connected to the electrode 22 is provided so as to straddle the boundary between the respective drain regions of the P-type double-gate MOS transistor structure and the N-type double-gate MOS transistor structure. The drain regions are electrically connected to each other via the electrode 22 so that a double-gate CMOS structure is formed. The electrode 21 may be composed of a material having a large value of work function close to that in the valence band so that the resistance of electrical contact with the source region of the P-type double-gate MOS transistor structure is relatively small. The electrode 23 may be composed of a material having a small value of work function close to that in the conduction band so that the resistance of electrical contact with the source region of the N-type double-gate MOS transistor structure is relatively small. Furthermore, the electrode 22 may be composed of a composite material whose P-type side is the same material as the former and whose N-type side is the same material as the latter. This serves to alleviate increase in contact resistance, which occurs more intensely as the areas of the electrode regions as viewed from the side surfaces become smaller. 24 denotes an insulating film that covers the side surfaces of the island-shaped semiconductor crystal layer. 25 denotes an insulating film that covers the side surfaces of the semiconductor crystal layer 3 outside the groove 6. The groove 6 may be finally filled with an insulator. In that case, preferably, an insulator having a low dielectric constant is used.

Figure 2:
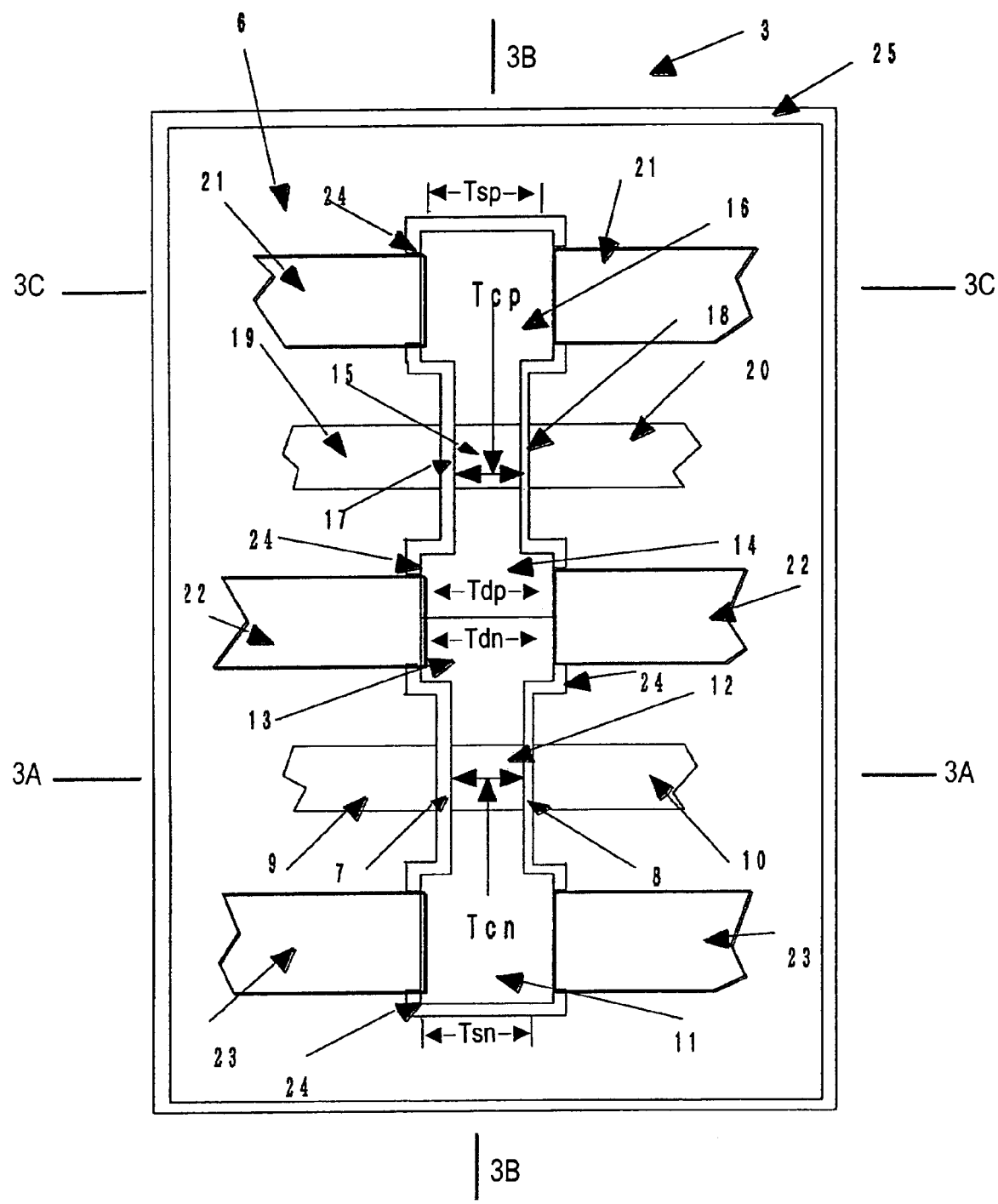
FIG. 2 shows a horizontal section according to another embodiment of the present invention.

FIG. 2 shows a horizontal section according to another embodiment of the present invention. Sections designated by the same numerals as in FIG. 1 have the same functions and operations. The thicknesses (Tsp and Tsn) of the respective source regions of the P-type double-gate MOS transistor structure and the N-type double-gate MOS transistor structure and the thicknesses (Tdp and Tdn) of sections of the respective drain regions thereof are greater than the thicknesses (Tcp and Tcn) of the remaining sections of the island-shaped semiconductor crystal layer. This serves to prevent corruption or deformation in a flattening process when electrical contacts between the surface and the respective regions are provided in a subsequent step as is usually the case or when the shape of horizontal section of the island-shaped semiconductor crystal layer becomes too thin. Particularly for the latter purpose, dimensional margins for forming the electrode regions are not needed, so that only an increase in thickness that is sufficient enough for the purpose suffices. This alleviates the problem of increase in chip area. Tcp and Tcn respectively denote the thicknesses of the channel regions of the P-type double-gate MOS transistor structure and the N-type double-gate MOS transistor structure. The thicknesses Tcp and Tcn may be less than the thicknesses of the drain regions and the source regions not facing the gate electrodes so that the effects of short channels (i.e., the distance between source and drain is short) are considerably suppressed.

FIGS. 3A-3C show a cross-sectional view of the double-gate CMOS structure. FIG. 3A is a cross-sectional view of the double-gate CMOS structure taken along Line 3A-3A shown in FIGS. 1 and 2, FIG. 3B is a cross-sectional view thereof, taken along Line 3B-3B shown in FIGS. 1 and 2, and FIG. 3C is a cross-sectional view thereof, taken along Line 3C-3C shown in FIGS. 1 and 2.

In FIG. 3A, 1 denotes a substrate, 2 denotes an insulating film, 3 denotes a semiconductor crystal layer having a predetermined height that determines the channel width of each transistor structure, 4 denotes a silicon oxide film, 5 denotes a silicon nitride film that functions as an etching mask in a flattening process, and 40 and 50 denote sections of the silicon oxide film 4 and the silicon nitride film 5 remaining on an island-shaped semiconductor crystal layer 31. The silicon oxide film 4 prevents deterioration of the crystal surface due to the silicon nitride film 5 coming into direct contact with the semiconductor crystal layer 3, and also functions as a mask when the silicon nitride film 5 is removed. In FIG. 3B, 11 denotes the source region of the N-type double-gate MOS transistor structure, 12 denotes the channel region thereof, and 13 denotes the drain region thereof. 14 denotes the drain region of the P-type double-gate MOS transistor structure, which is in contact with the drain region 13, 15 denotes the channel region thereof, and 16 denotes the source region thereof. FIGS. 1 and 2 show horizontal cross-sectional views, taken along Line 1,2-1,2 shown in FIG. 3B. FIG. 3C is a vertical section including the drain electrode and the drain electrode region of the P-type double-gate MOS transistor structure. Sections designated by the same numerals throughout the figures have the same functions and same operations. In order to provide contact between the drain region 16 and the drain electrode 21, sections of the oxide films 24 on the side surfaces are removed. The same applies to a vertical section including the source contact region.

In the embodiment of double-gate CMOS structure described above, in order to form the gate electrodes, the source electrodes, and the drain electrodes by self-alignment, the gate oxide films must remain, the oxide films in the contact regions of the source drain regions must be removed, and the layout of the electrode patterns must be determined (i.e., positioning must be determined) by a single lithography process. That is, all the regions are patterned by a single lithography process, and sections of the patterned regions are removed in manufacturing stepes of the respective regions, and processes are performed as needed to form the respective regions (e.g., the source electrode regions and the drain electrode regions).

Now, a manufacturing step according to an embodiment of the present invention, which is an improvement of a manufacturing step disclosed in Japanese Patent No. 3488916, will be described.

Figure 4A:
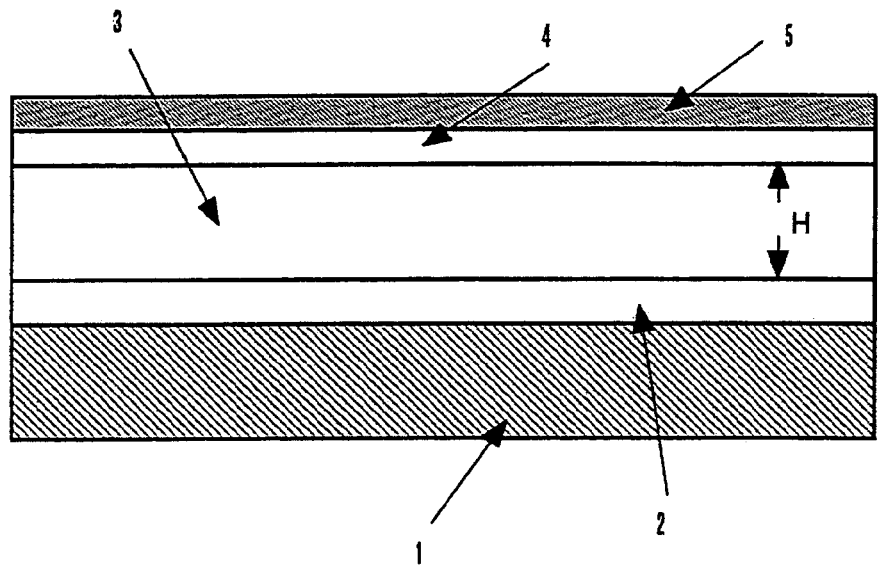
FIGS. 4A and 4B are a diagram for explaining a manufacturing step 1 of a double-gate MOS transistor, respectively.
Figure 4B:
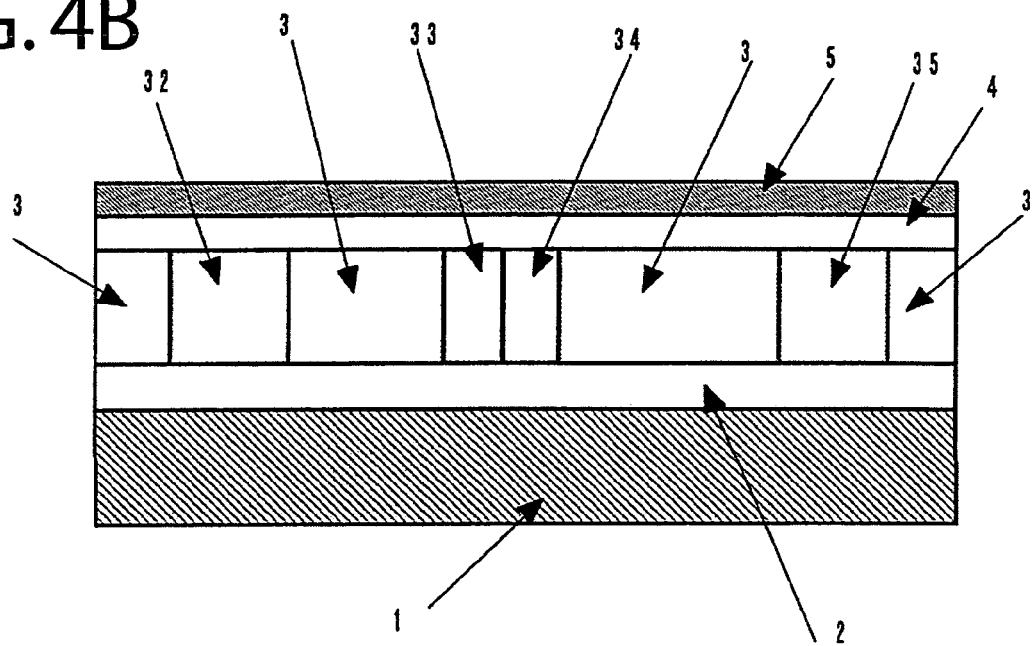

FIGS. 4A and 4B are diagrams for explaining a manufacturing step 1 of a double-gate MOS transistor according to the present invention.

First, as shown in a vertical section in FIG. 4A, a semiconductor crystal layer 3 having a predetermined height H, insulated by an oxide film 2, is formed on a substrate 1. The oxide film 2 may be replaced by other materials that function as insulators. Usually, the semiconductor crystal layer 3 is not doped with impurities. Over the semiconductor crystal layer 3, a silicon oxide film 4 and a silicon nitride film 5 are formed or laminated. At that time, before forming or laminating the silicon oxide film 4 and the silicon nitride film 5, heavily doped P-type impurity regions 32 and 33 and heavily doped N-type impurity regions 34 and 35 are formed so as to be disposed linearly with appropriate gaps, as shown in a vertical section in FIG. 4B. In this case, the heavily doped P-type impurity region 33 and the heavily doped N-type impurity region 34 are formed so as to be in contact with each other.

Figure 5A:
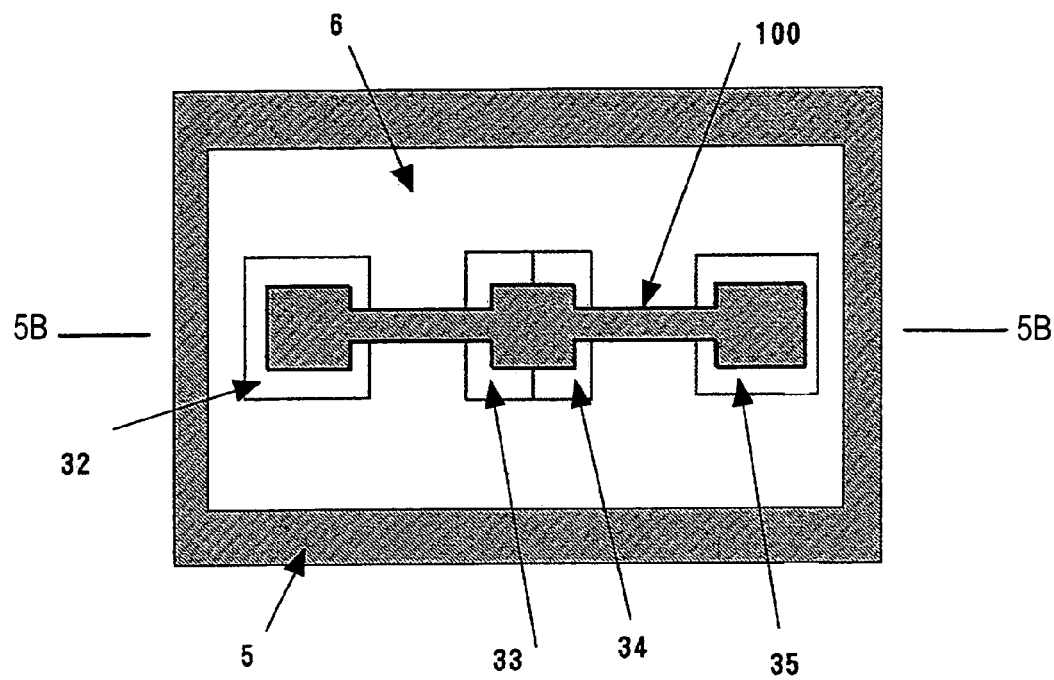
FIGS. 5A and 5B are a diagram for explaining a manufacturing step 2 of the double-gate MOS transistor, respectively.
Figure 5B:
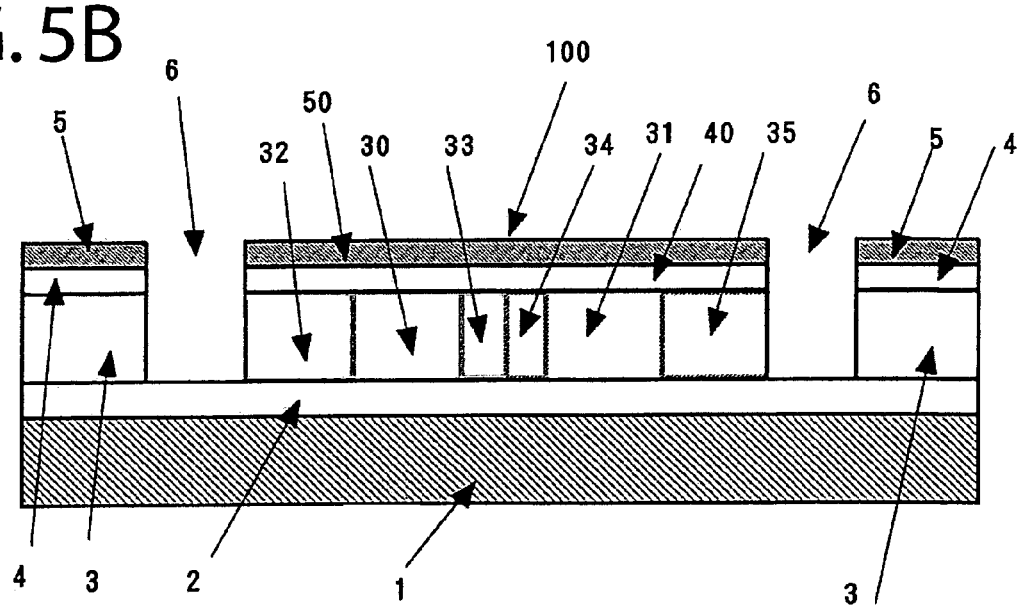

FIGS. 5A and 5B are diagrams for explaining a manufacturing step 2 of a double-gate MOS transistor according to the present invention.

As shown in a top plan view of FIG. 5A and a cross-sectional view of the double-gate MOS transistor in FIG. 5B, a groove 6 having a depth at least extending to the surface of the oxide film 2 is formed. Furthermore, in the groove 6, an island-shaped semiconductor crystal layer 100 having a predetermined shape of horizontal section is formed. The island-shaped semiconductor crystal layer 100 includes sections 30 to 35 of the semiconductor crystal layer 3 and sections 40 and 50 of the silicon oxide film 4 and the silicon nitride film 5 formed or laminated thereover. The relationship between the positions of the pattern of the heavily doped impurity regions and the pattern island-shaped semiconductor crystal layer 100 is such that the island-shaped semiconductor crystal layer 100 straddles the boundary between the P-type heavily doped impurity region 33 and the N-type heavily doped impurity region 34, with the respective ends thereof located inside the P-type heavily doped impurity region 32 and the N-type heavily doped impurity region 35, as shown in FIG. 5A. In FIG. 5B, 30 and 31 denote sections or portions of the semiconductor crystal layer 3, corresponding to the channel regions of P-type and N-type double-gate MOS transistor structures, formed in a process described later.

Figure 6A:
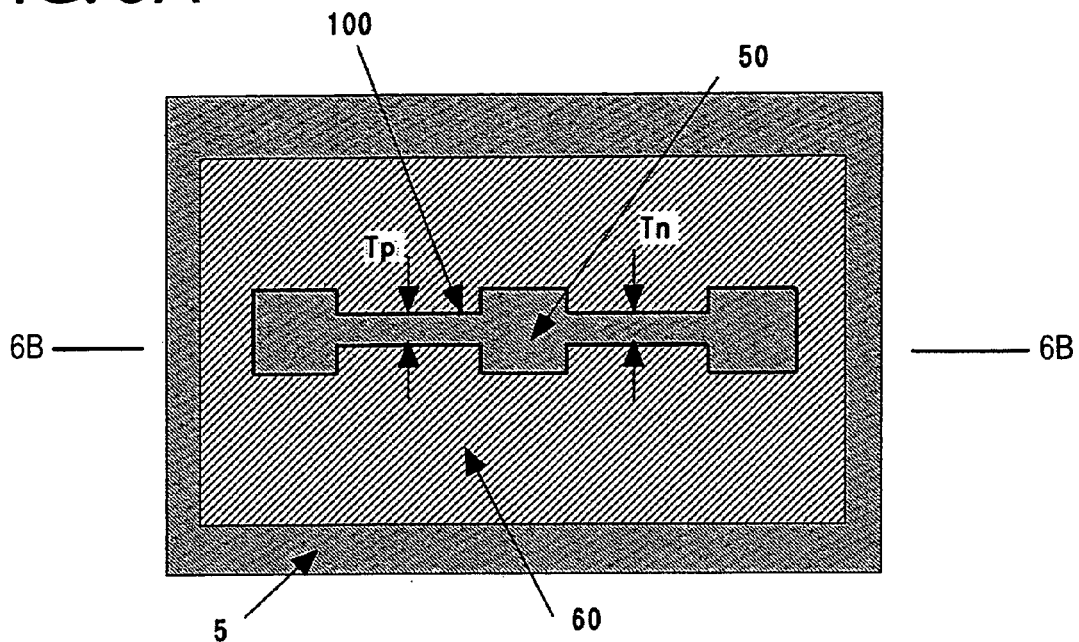
FIGS. 6A and 6B are a diagram for explaining a manufacturing step 3 of the double-gate MOS transistor, respectively.
Figure 6B:
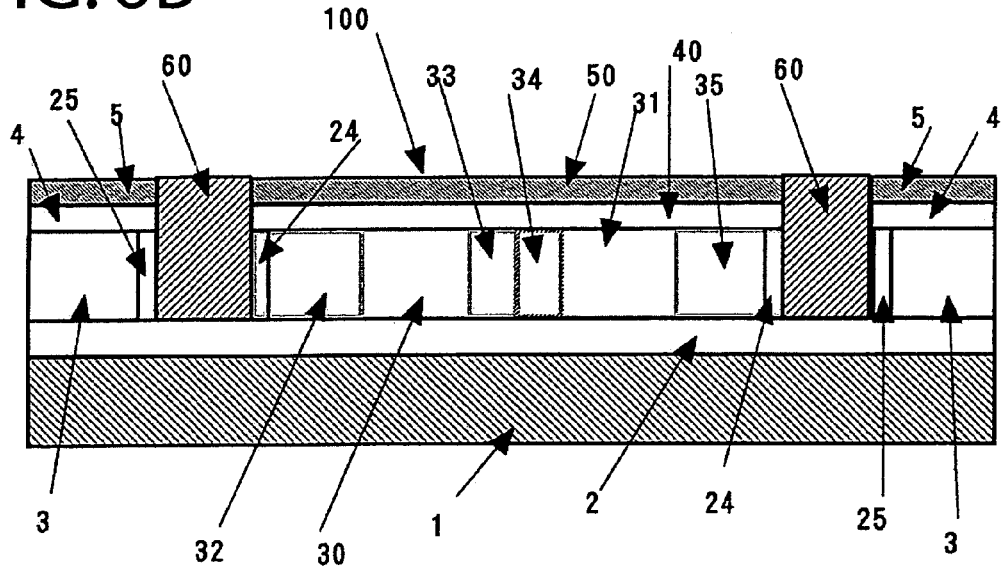

FIGS. 6A and 6B are diagrams for explaining a manufacturing step 3 of a double-gate MOS transistor according to the present invention.

As shown in FIGS. 6A and 6B, after forming the semiconductor crystal layer of the island-shaped semiconductor crystal layer 100 exposed to the groove 6, forming oxide films 24 on the side surfaces of the regions 32 to 35, and forming oxide films 25 on the semiconductor crystal layer 3 in the periphery of the groove 6, a polycrystalline silicon layer 60 is filled in. At this time, it is advantageous to perform flattening as in the cross-sectional view taken along 6A and 6B shown in FIG. 6B in order to improve the precision of subsequent processes. The silicon nitride films 5 and 50 function as etching masks in the flattening process. The thicknesses Tp and Tn of the regions where the channel regions of the P-type and N-type double-gate MOS transistor structures are formed when the island-shaped semiconductor crystal layer 100 is formed, shown in FIG. 6A, may be such that Tp>Tn. This is effective to cancel the effect of the stray resistance in the P-type source region and drain region being greater than that in the N-type source region and drain region, and to adjust the threshold voltage of the P-type double-gate MOS transistor structure to be small, so that the material of the gate electrodes can be selected flexibly.

Figure 7:
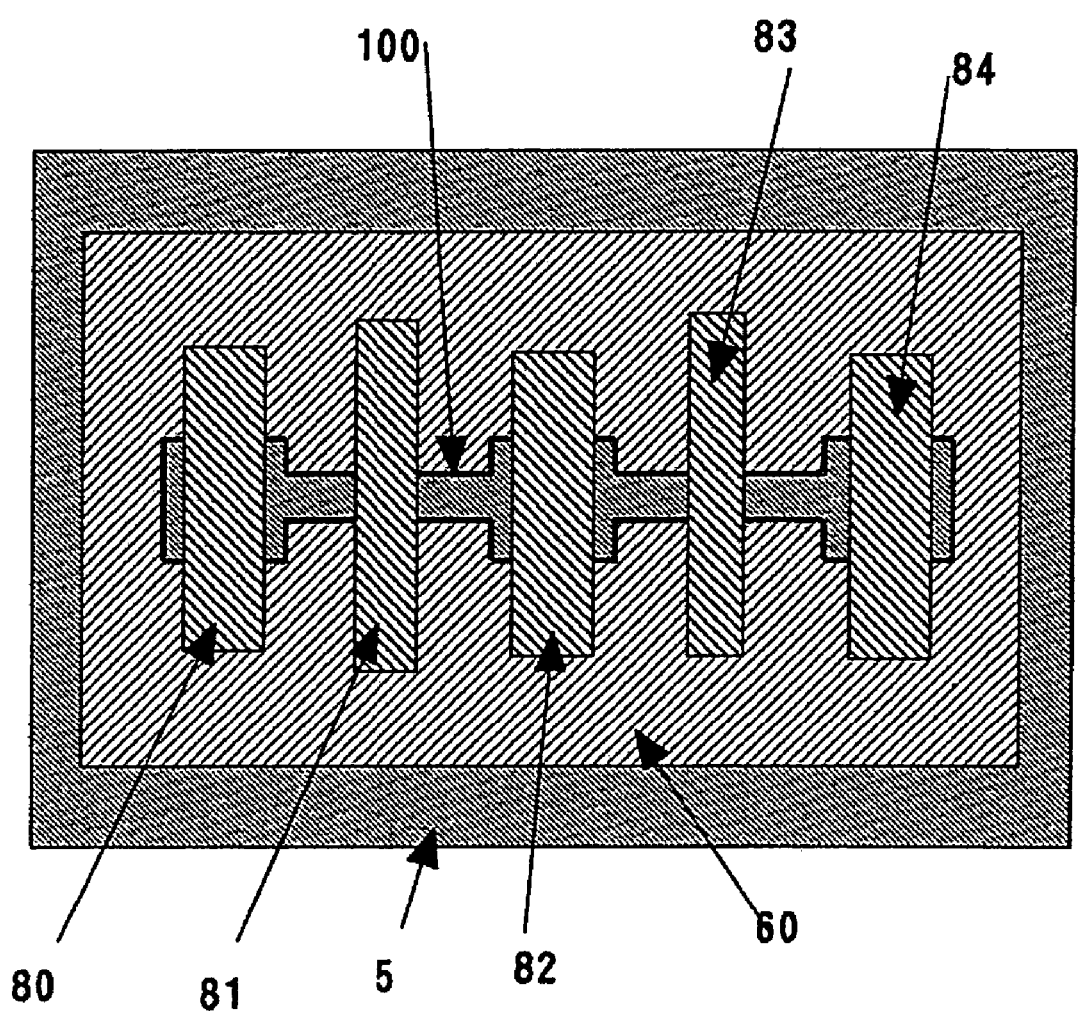
FIG. 7 is a diagram for explaining a manufacturing step 4 of the double-gate MOS transistor according to the present invention.

FIG. 7 is a diagram for explaining a manufacturing step 4 of the double-gate MOS transistor according to the present invention.

Figure 8:
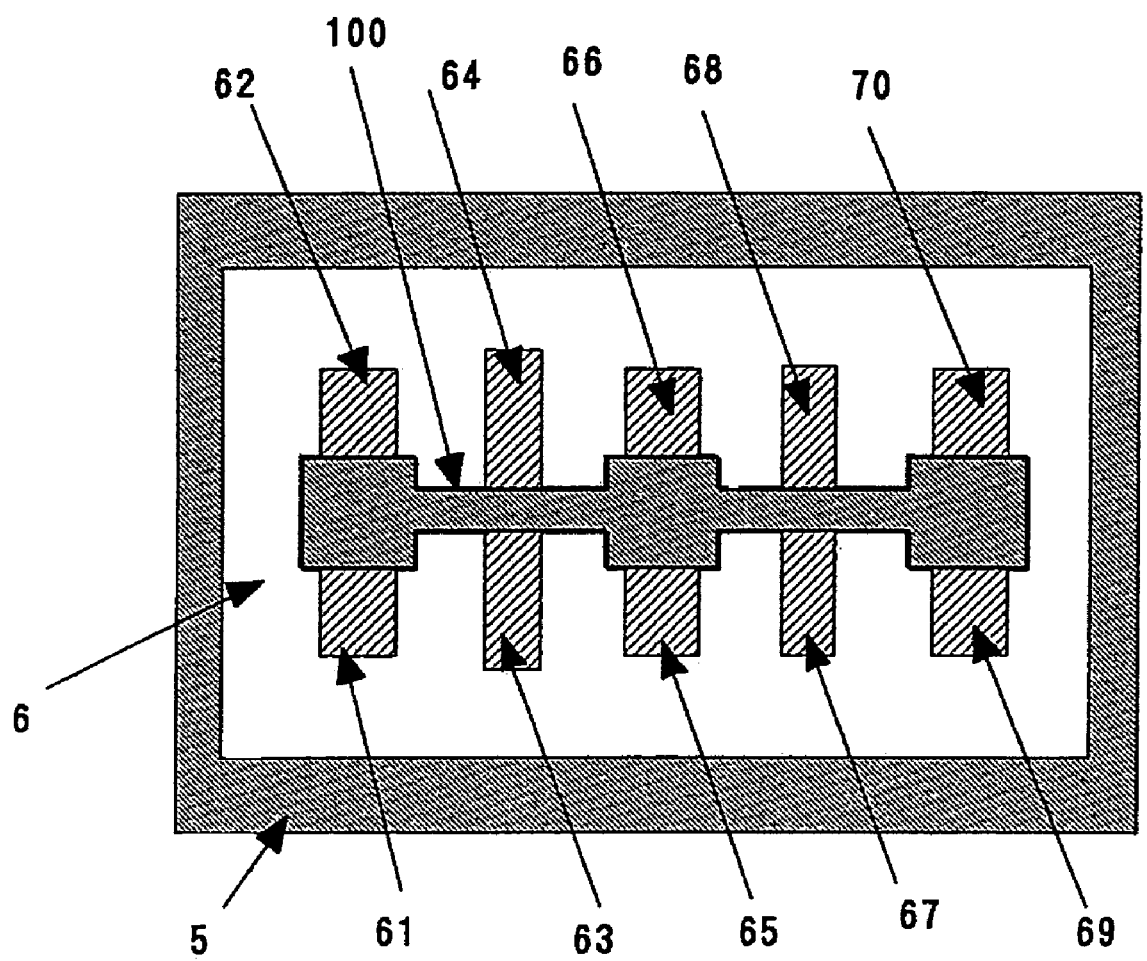
FIG. 8 is a diagram for explaining a manufacturing step 5 of the double-gate MOS transistor according to the present invention.

As shown in FIG. 7, a set of mask patterns 80 to 84 traversing the island-shaped semiconductor crystal layer 100 in the thickness direction thereof is formed so that the mask patterns 80, 82, and 84 are located at the respective drain electrode regions and source electrode regions while the mask patterns 81 and 83 are located at the gate electrode regions. The polycrystalline silicon 60 in the groove 6 is removed by etching using these mask patterns. The mask patterns may be formed of resist films, or may be formed by patterning a silicon oxide layer formed or laminated on the surface. In this case, the oxide films 24 on the side surfaces of the island-shaped semiconductor crystal layer 100 and the oxide films 25 on the side surfaces of the remaining semiconductor crystal layer 3 function as masks to prevent etching of the respective side surfaces. FIG. 8 is a diagram for explaining a manufacturing step 5 of the double-gate MOS transistor according to the present invention. As shown in FIG. 8, a set of island-shaped polycrystalline silicon layers 61 to 70 respectively in contact via the oxide films 24 with specific side electrode regions of the island-shaped semiconductor crystal layer 100 exposed to the groove 6 is formed by a single process, whereby the layout of the respective electrodes is determined by self-alignment.

Figure 9:
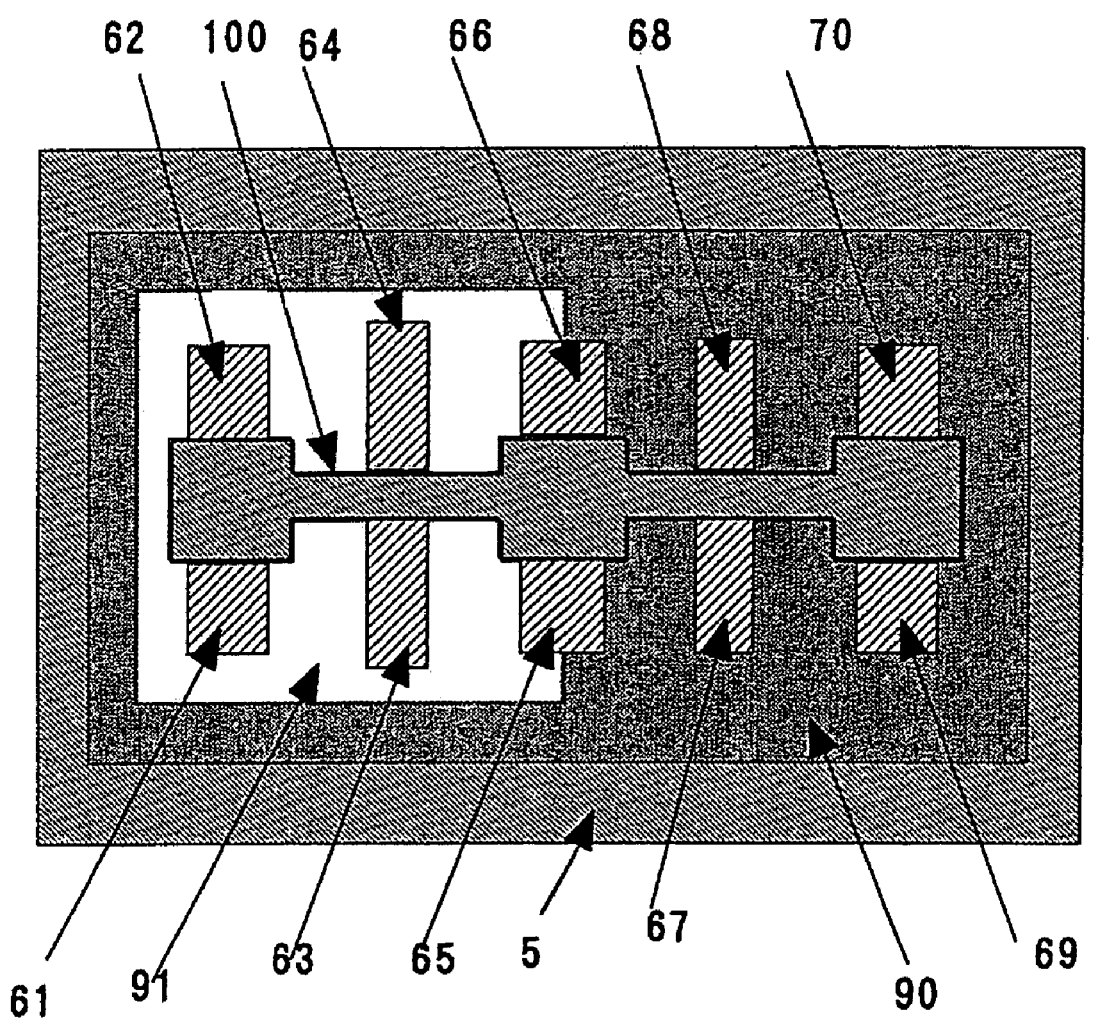
FIG. 9 is a diagram for explaining a manufacturing step 6 of the double-gate MOS transistor according to the present invention.

FIG. 9 is a diagram for explaining a manufacturing step 6 of the double-gate MOS transistor according to the present invention.

Figure 10:
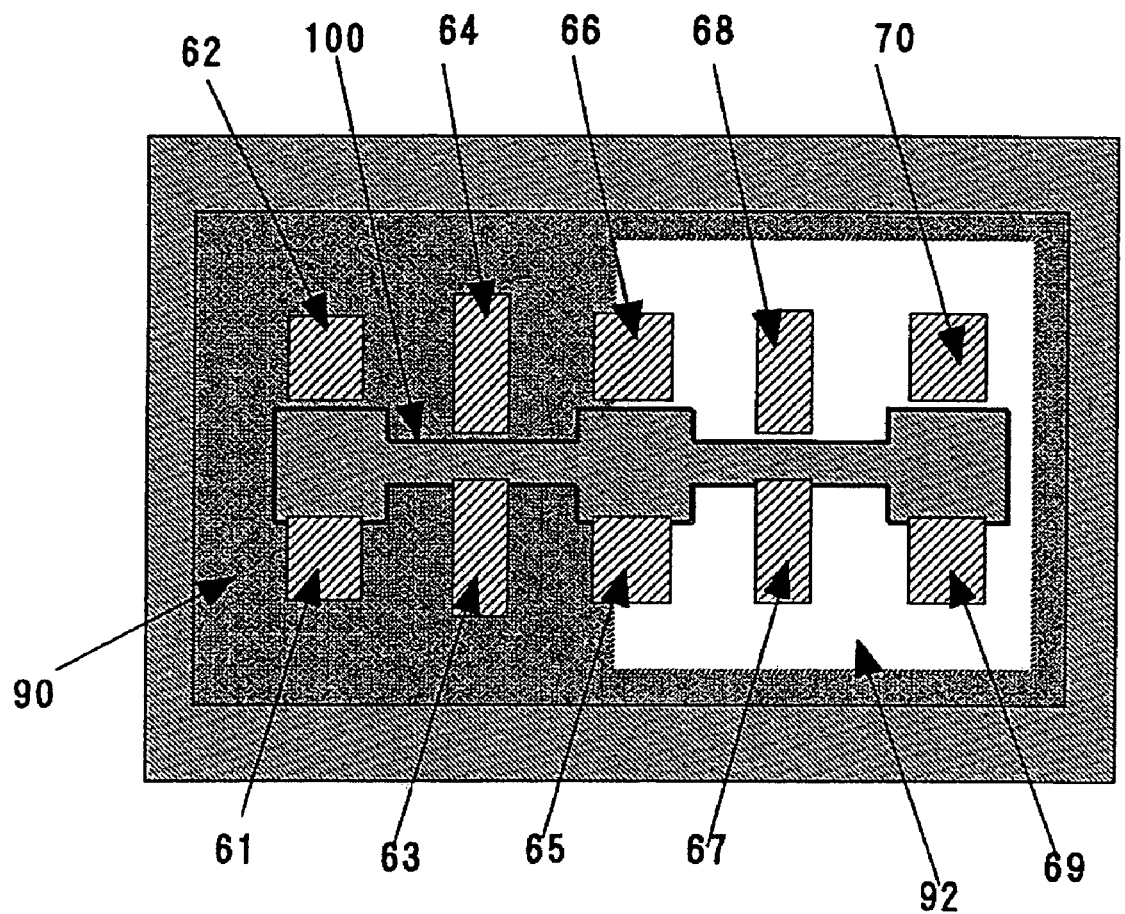
FIG. 10 is a diagram for explaining a manufacturing step 7 of the double-gate MOS transistor according to the present invention.

FIG. 10 is a diagram for explaining a manufacturing step 7 of the double-gate MOS transistor according to the present invention.

As shown in FIG. 9, the groove 6 is filled with a silicon oxide film 90 and flattening is performed. Then, an opening that includes at least the side surfaces of the island-shaped semiconductor crystal layer 100 between the source electrode region and the drain electrode region of the P-type double-gate MOS transistor structure is formed, and the silicon oxide film 90 is etched to form a groove 91 having a depth extending to the insulating film 2, whereby the side surfaces of the island-shaped semiconductor crystal layer 100 and sections of the side surfaces of the island-shaped polycrystalline silicon layers 61 to 64 are exposed to the groove 91. In this process, the oxide films 24 on the side surfaces of the semiconductor crystal layer 100 exposed to the groove 91, not masked by the island-shaped polycrystalline silicon layers 61 to 66, is simultaneously etched so that the side surfaces of the island-shaped semiconductor crystal layer 100 are exposed. Then, highly concentrated P-type impurities are introduced from the exposed surfaces. At this time, the oxide films 24 are remaining on the side surfaces of the channel region sandwiched by the island-shaped polycrystalline silicon layers 63 and 64, so that the channel region is not entirely doped heavily with impurities. As a method of doping, for example, the groove 91 is filled with silicate glass heavily doped with boron, and impurities are introduced in a very shallow region by rapid thermal annealing (RTA). Then, the silicate glass is removed, and the groove 91 is again filled with a silicon oxide film 90 and flattening is performed. (Alternatively, the groove 91 is filled with the silicon oxide film 90 without performing flattening.)

Furthermore, as shown in FIG. 10, an opening that includes at least the side surfaces of the island-shaped semiconductor crystal layer 100 between the source region and the drain region of the N-type double-gate MOS transistor structure is formed, and the silicon oxide film 90 is etched to form a groove 92 having a depth extending to the insulating film 2. Then, by a procedure similar to that described above, highly concentrated N-type impurities are introduced using, for example, silicate glass doped with phosphorus. Also in this case, the effects of the island-shaped polycrystalline silicon layers 67 and 68 are the same as those of the island-shaped polycrystalline silicon layers 67 and 68, so that the channel region of the N-type double-gate MOS transistor is not entirely doped heavily with impurities.

Figure 11A:
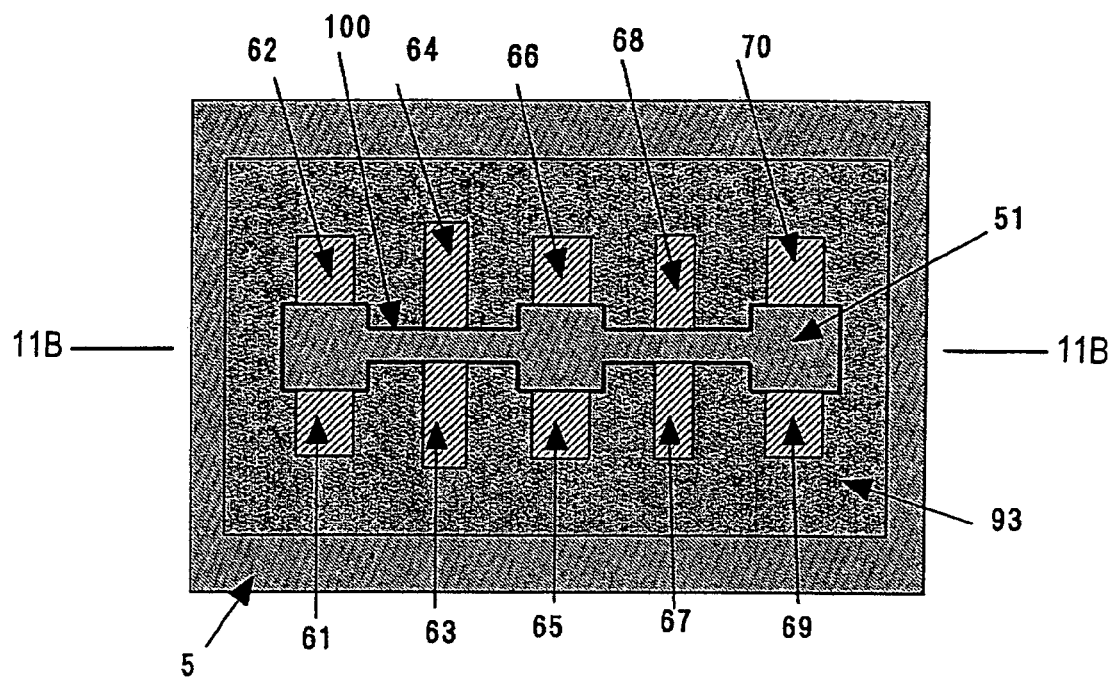
FIGS. 11A and 11B are a diagram for explaining a manufacturing step 8 of the double-gate MOS transistor, respectively.
Figure 11B:
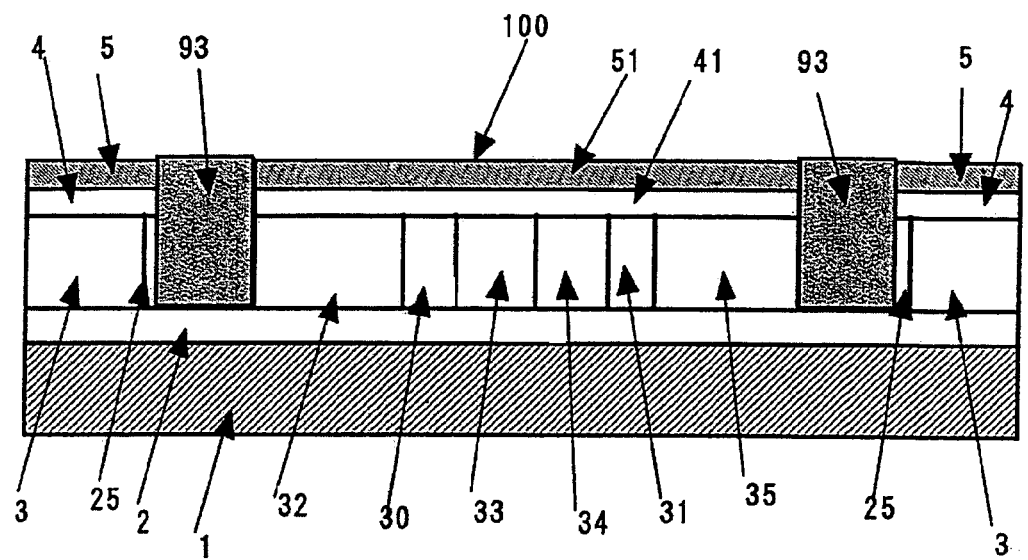

FIGS. 11A and 11B are diagrams for explaining a manufacturing step 8 of the double-gate MOS transistor according to the present invention.

As shown in FIG. 11A, the groove 92 is filled with an oxide film 93 and flattening is performed. FIG. 11B shows a cross-sectional view thereof taken along Line 11B-11B shown in FIG. 11A. In the figure, 30 denotes the channel region of the P-type double-gate MOS transistor structure, sandwiched by the island-shaped polycrystalline silicon layers 63 and 64, and 31 denotes the channel region of the N-type double-gate MOS transistor structure, sandwiched by the island-shaped polycrystalline silicon layers 67 and 68. 32 denotes the source region of the P-type double-gate MOS transistor structure, expanded by introducing highly concentrated P-type impurities from the side surfaces in this process, and 33 denotes the similarly expanded drain region. 34 and 35 respectively denote the drain region and the source region of the N-type double-gate MOS transistor structure, expanded by introducing highly concentrated N-type impurities from the side surfaces.

Figure 12:
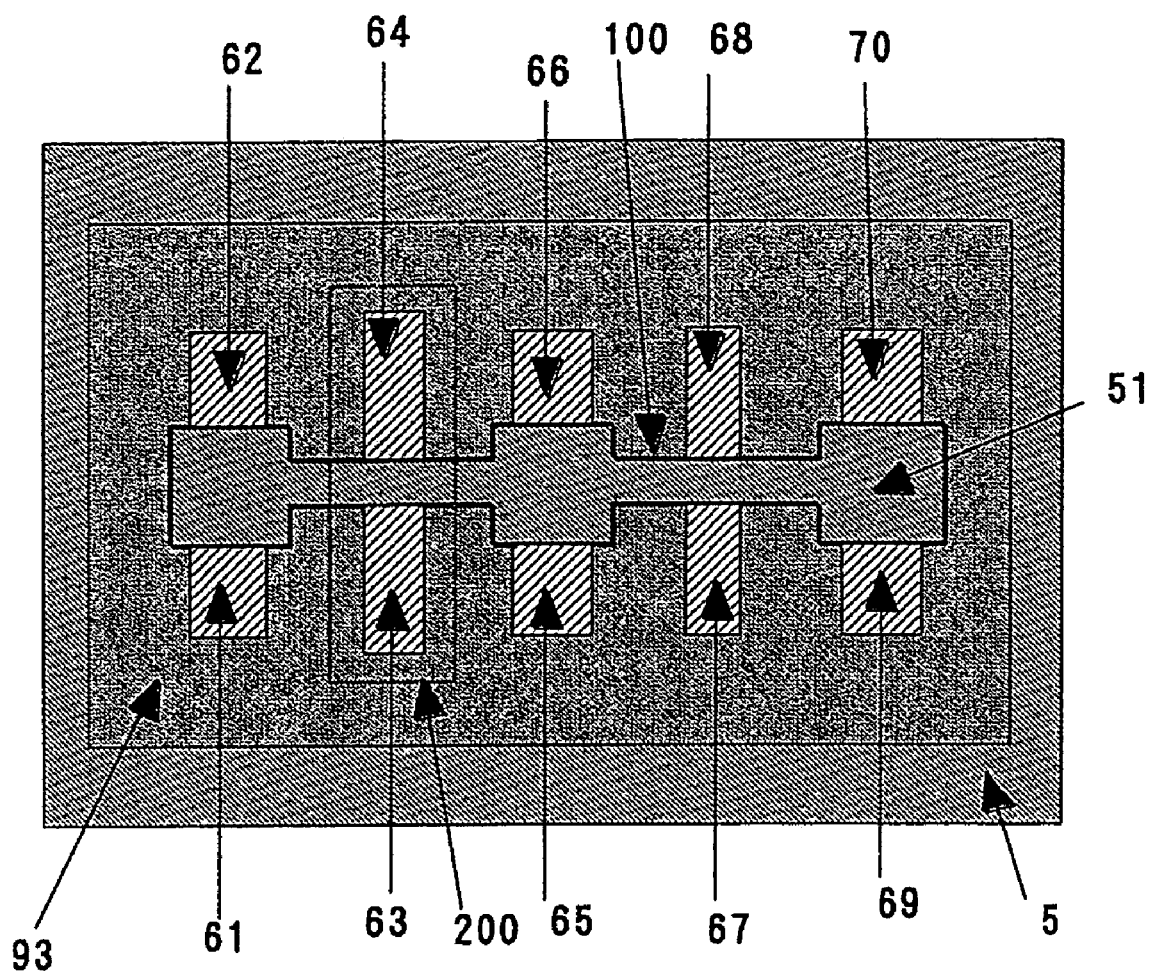
FIG. 12 is a diagram for explaining a manufacturing step 9 of the double-gate MOS transistor according to the present invention.

FIG. 12 is the diagram for explaining a manufacturing step 9 of a double-gate MOS transistor according to the present invention.

Figure 13:
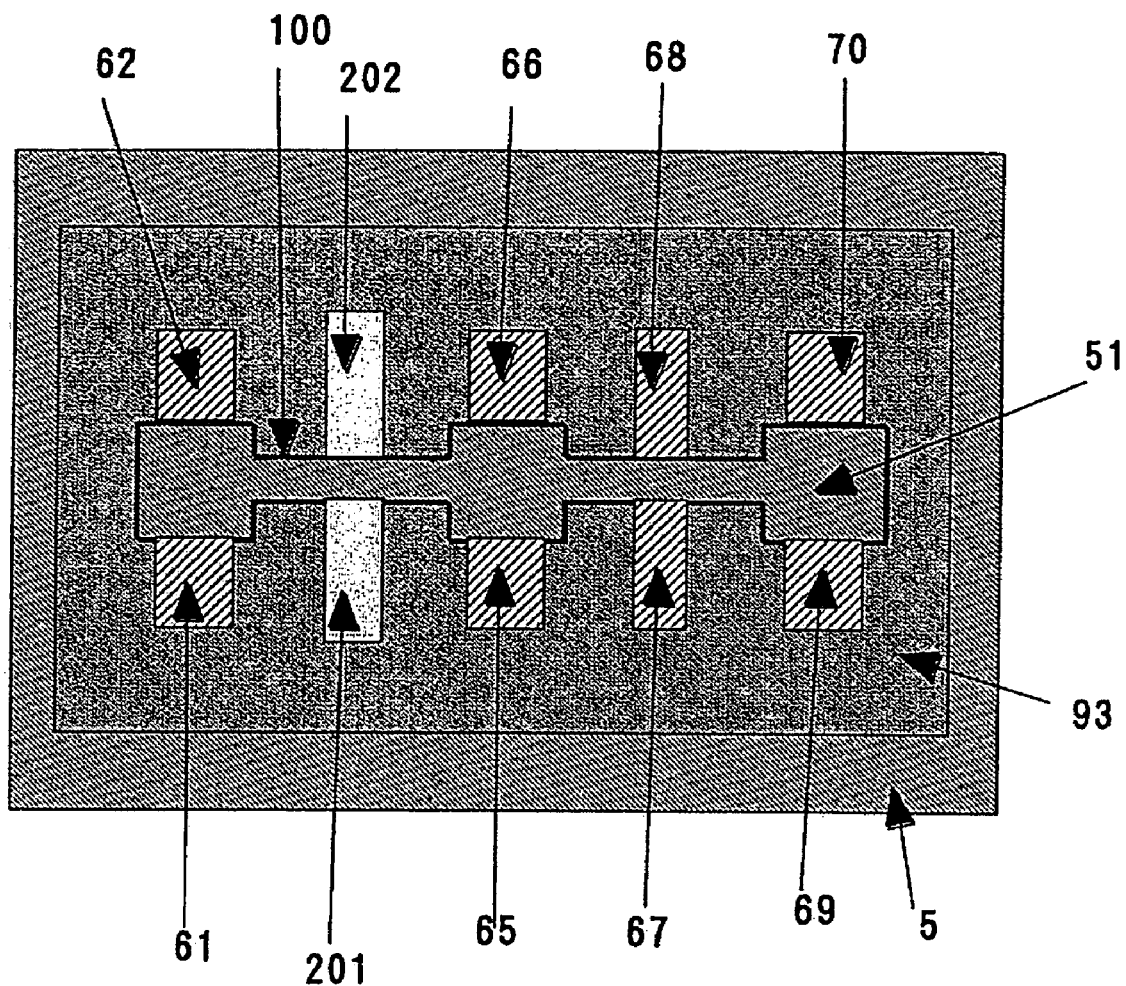
FIG. 13 is a diagram for explaining a manufacturing step 10 of the double-gate MOS transistor according to the present invention.

FIG. 13 is the diagram for explaining a manufacturing step 10 of a double-gate-MOS transistor according to the present invention.

Figure 14:
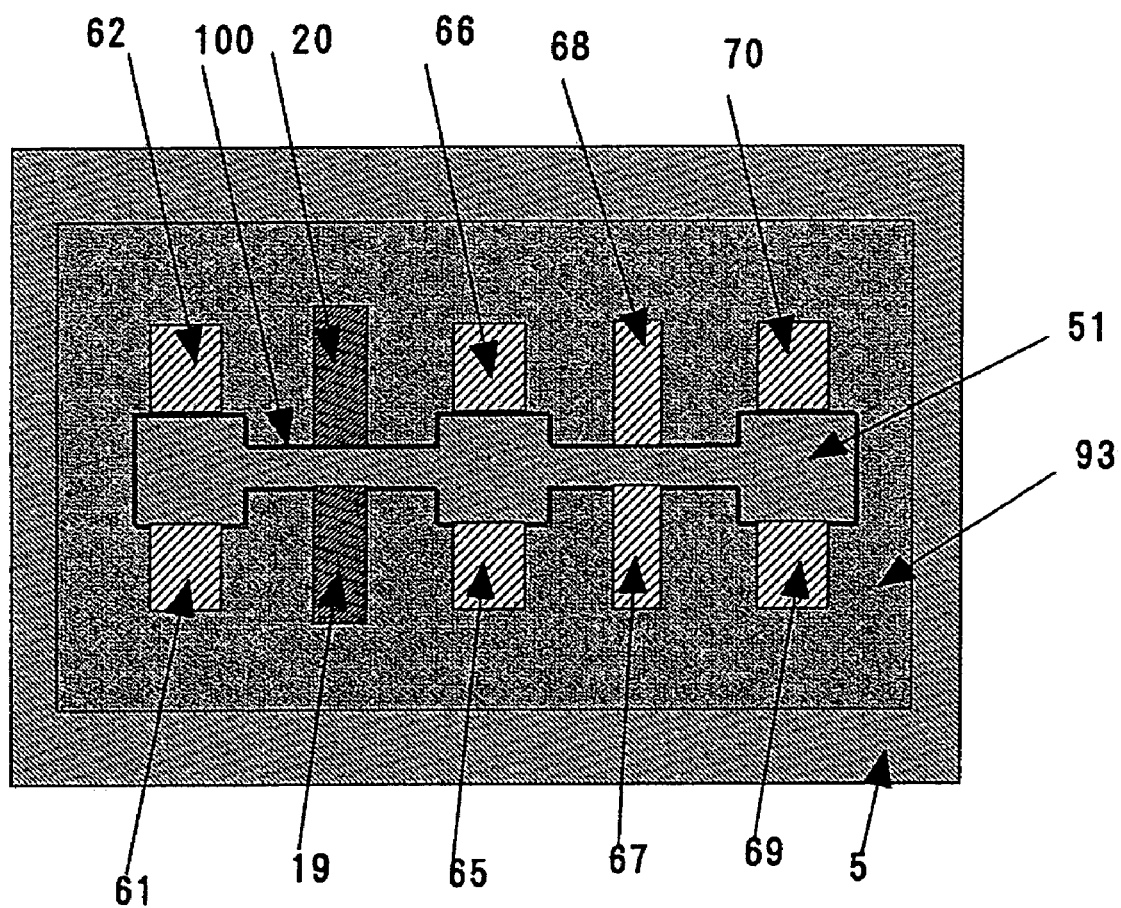
FIG. 14 is a diagram for explaining a manufacturing step 11 of the double-gate MOS transistor according to the present invention.

FIG. 14 is the diagram for explaining a manufacturing step 11 of a double-gate MOS transistor according to the present invention.

As shown in FIG. 12, mask material, such as a resist or a silicon oxide film, is formed or laminated on the surface, and an opening 200 is formed therein, the opening 200 traversing the island-shaped semiconductor crystal layer 100 in the thickness direction thereof and causing only the surfaces of the polycrystalline silicon layers 63 and 64 among the polycrystalline silicon layers 61 to 70 to be exposed. Then, the island-shaped polycrystalline silicon layers 63 and 64 are etched through the opening 200, forming a set of grooves 201 and 202 having depths extending to the insulating film 2, as shown in FIG. 13. Then, the mask material is removed, the remaining silicon oxide films 24 are etched to expose the side surfaces of the channel region 30, the side surfaces of the semiconductor crystal of the channel region 30 is etched so that the thickness of the channel becomes a predetermined thickness, and then gate oxide films are formed. Depending on cases, the gate oxide films may be formed without performing the etching process, or the remaining silicon oxide films 24 may be used as the gate oxide films. Then, as shown in FIG. 14, the grooves 201 and 202 are filled with electrode material, such as a first metal or silicide, having such a work function with which the threshold voltage of the P-type double-gate MOS transistor structure becomes a predetermined value, a flattening process is performed, and then gate electrodes 19 and 20 are formed.

Figure 15:
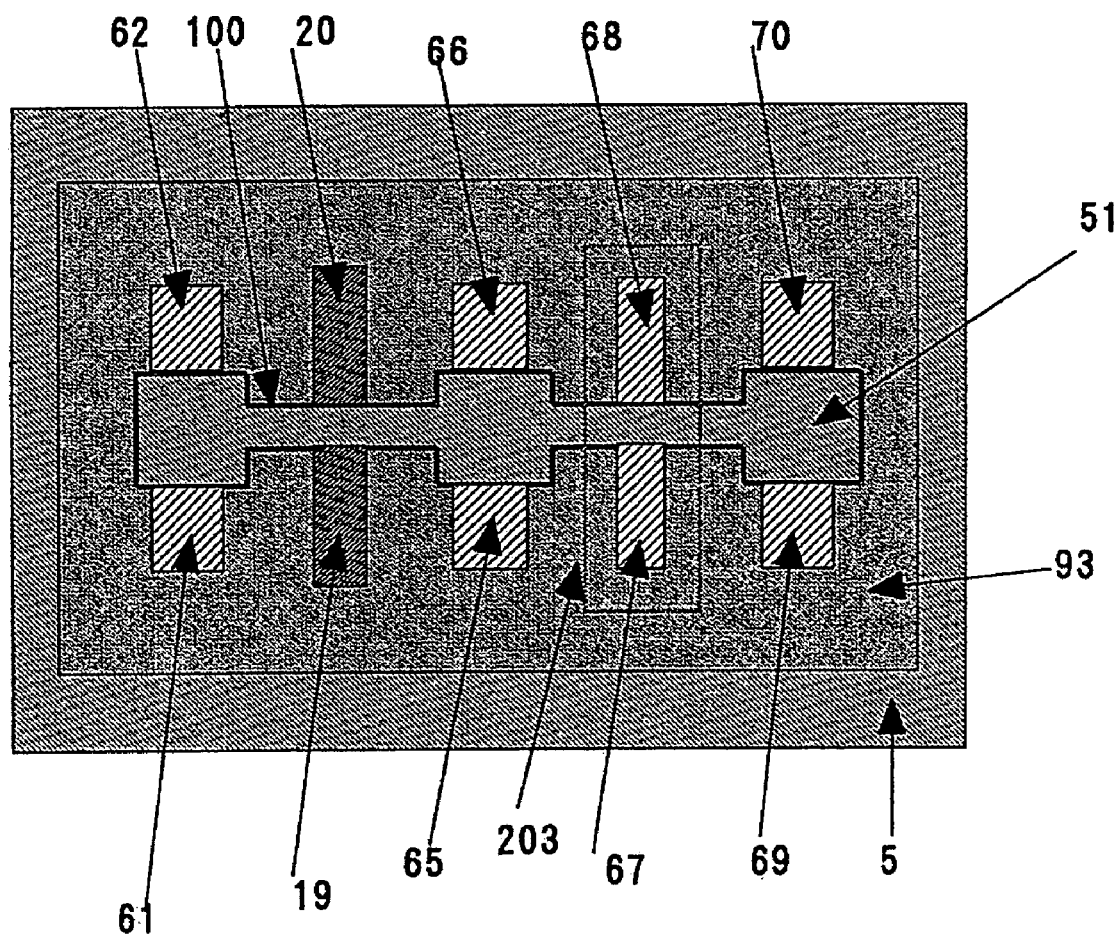
FIG. 15 is a diagram for explaining a manufacturing step 12 of the double-gate MOS transistor structure according to the present invention.

FIG. 15 is a diagram for explaining a manufacturing step 12 of a double-gate MOS transistor structure according to the present invention.

Figure 16:
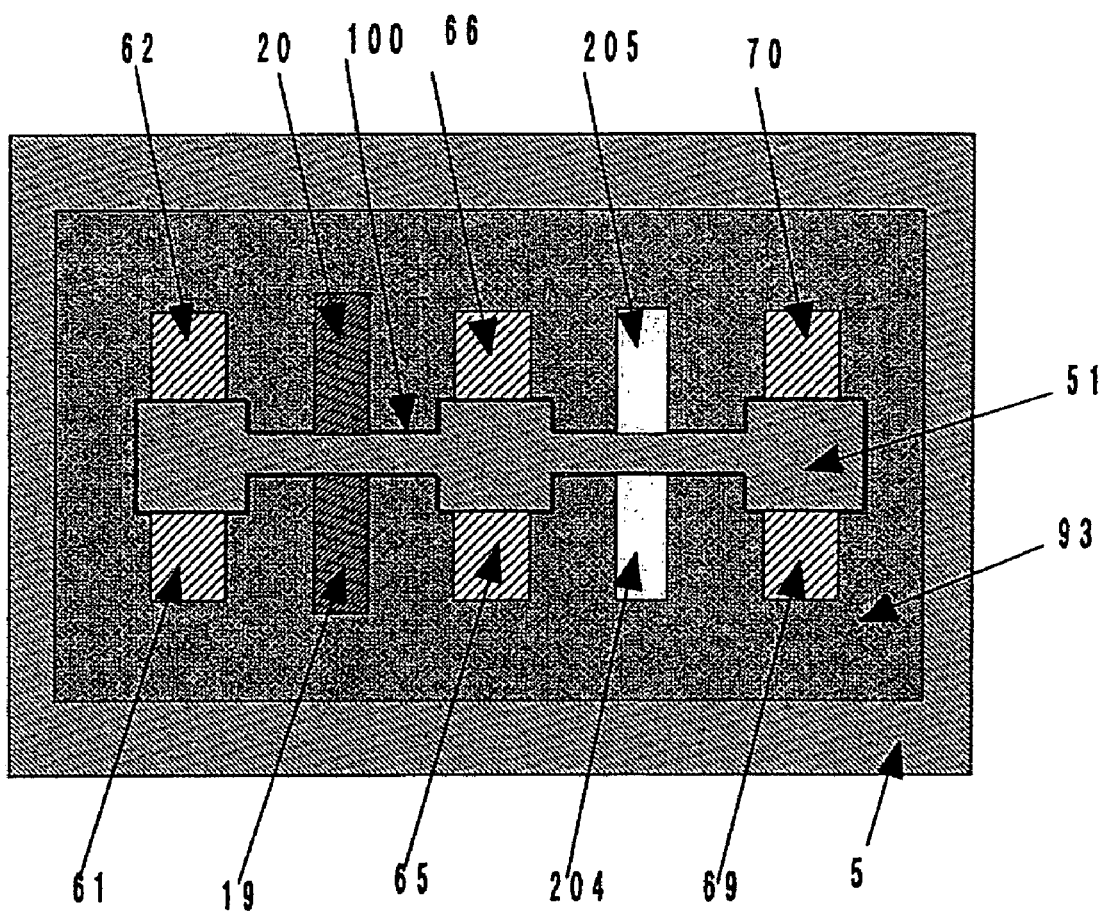
FIG. 16 is a diagram for explaining a manufacturing step 13 of the double-gate MOS transistor structure according to the present invention.

FIG. 16 is a diagram for explaining a manufacturing step 13 of a double-gate MOS transistor structure according to the present invention.

Figure 17:
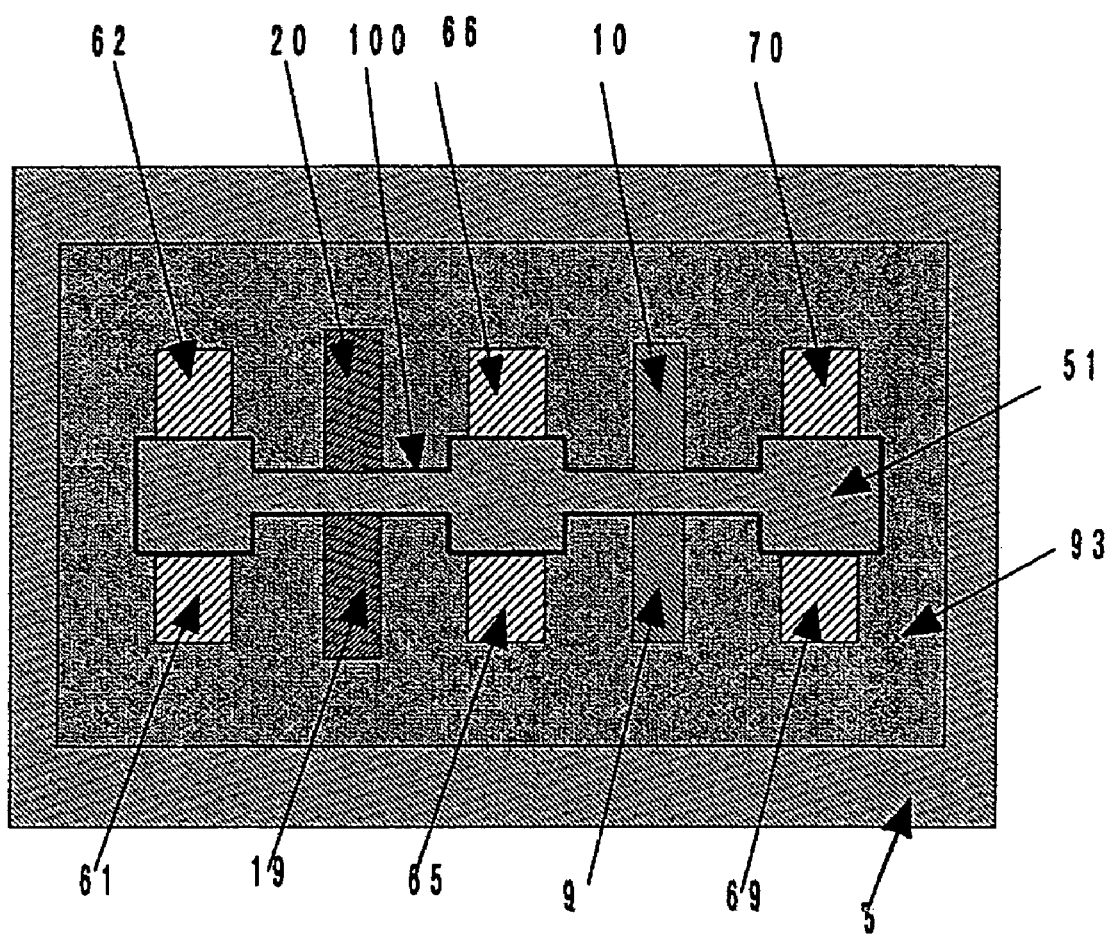
FIG. 17 is a diagram for explaining a manufacturing step 14 of the double-gate MOS transistor structure according to the present invention.

FIG. 17 is a diagram for explaining a manufacturing step 14 of a double-gate MOS transistor structure according to the present invention.

As shown in FIG. 15, mask material, such as a resist or a silicon oxide film, is formed or laminated on the surface, and an opening 203 is formed therein, the opening 203 traversing the island-shaped semiconductor crystal layer 100 in the thickness direction thereof and causing only the surfaces of the polycrystalline silicon layers 67 and 68 among the polycrystalline silicon layers 61 to 70 to be exposed. Then, the island-shaped polycrystalline silicon layers 67 and 68 are etched through the opening 203, forming a set of grooves 204 and 205 having depths extending to the insulating film 2, as shown in FIG. 16. Then, the mask material is removed, the remaining silicon oxide films 24 are etched to expose the side surfaces of the channel region 31, the side surfaces of the semiconductor crystal of the channel region 31 is etched so that the thickness of the channel becomes a predetermined thickness, and then gate oxide films are formed. When the gate electrodes 19 and 20 formed earlier are composed of metal, a thermal process for forming gate oxide films is not desired, so that the etching process is omitted and the remaining silicon oxide films 24 are used as the gate oxide films. Then, as shown in FIG. 17, the grooves 204 and 205 are filled with electrode material, such as a second metal or silicide, having such a work function with which the threshold voltage of the N-type double-gate MOS transistor structure becomes a predetermined value, a flattening process is performed, and then gate electrodes 9 and 10 are formed.

Figure 18:
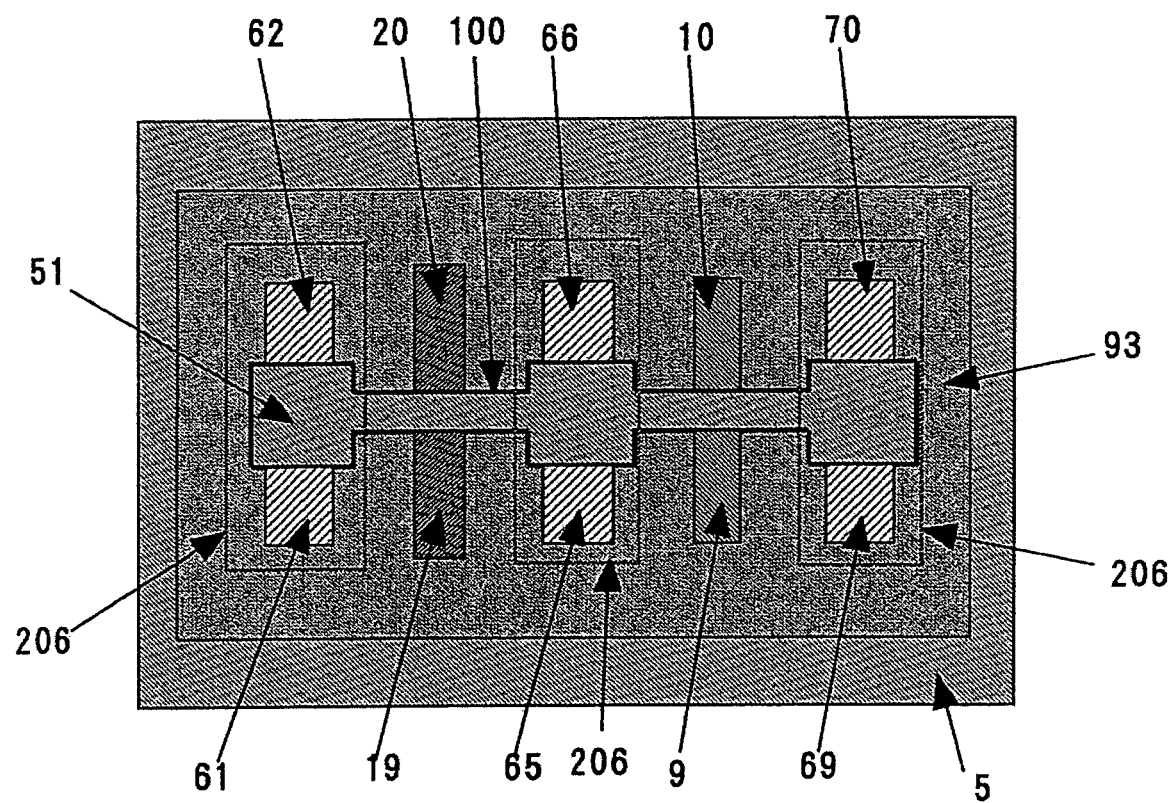
FIG. 18 is a diagram for explaining a manufacturing step 15 of the double-gate MOS transistor according to the present invention.

FIG. 18 is a diagram for explaining a manufacturing step 15 of a double-gate MOS transistor according to the present invention.

Figure 19:
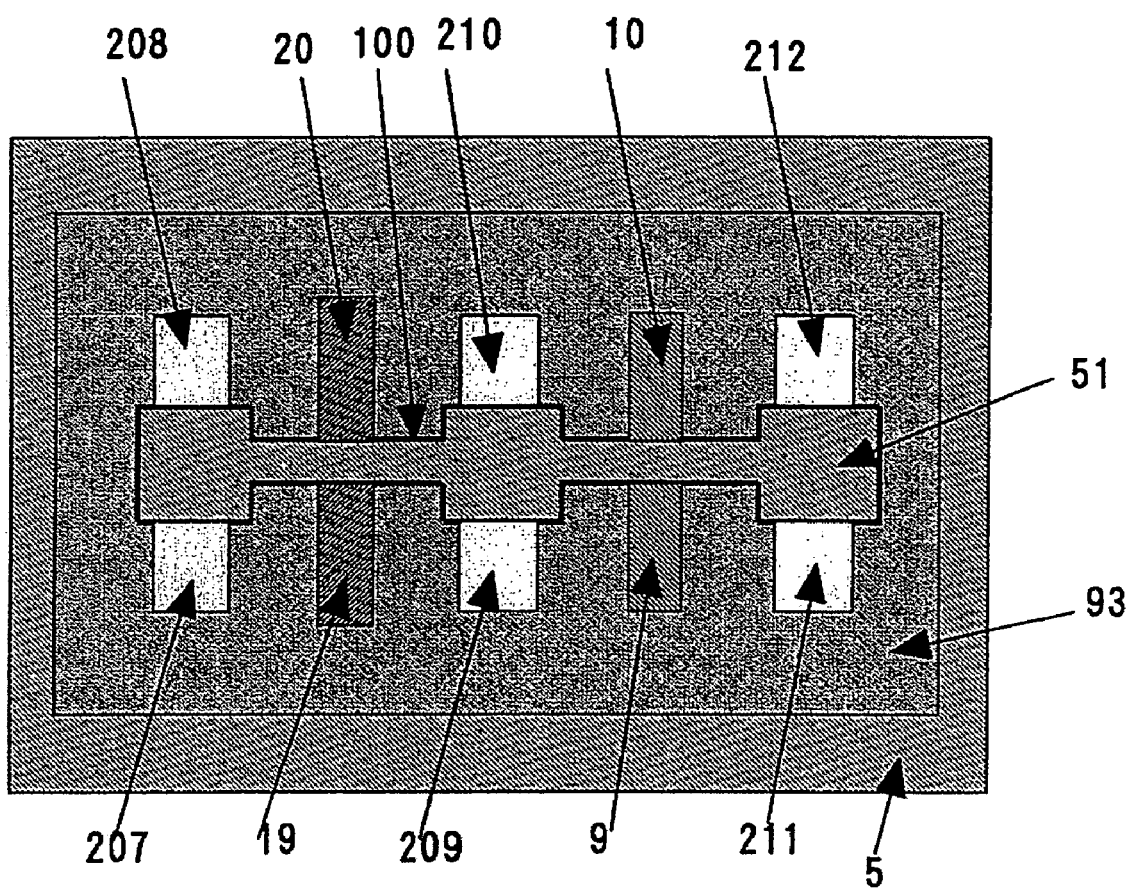
FIG. 19 is a diagram for explaining a manufacturing step 16 of the double-gate MOS transistor according to the present invention.

FIG. 19 is a diagram for explaining a manufacturing step 16 of a double-gate MOS transistor according to the present invention.

Figure 20:
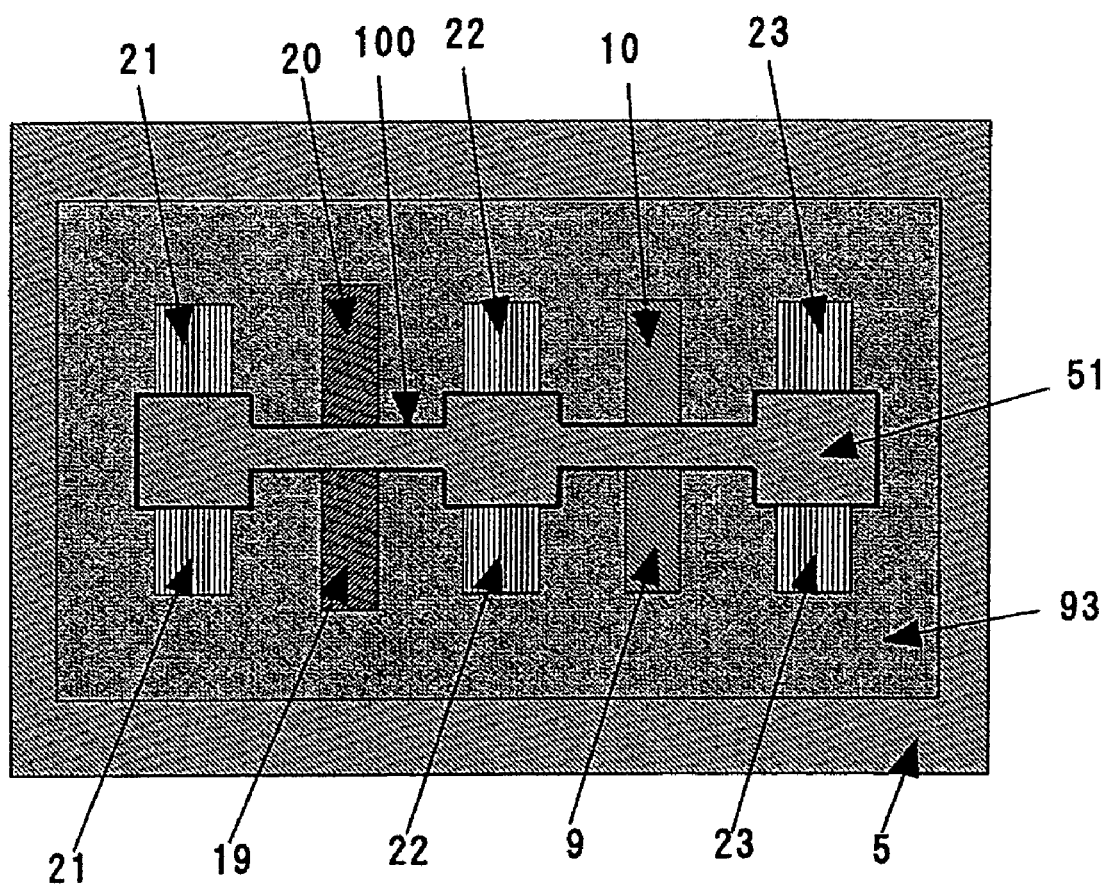
FIG. 20 is a diagram for explaining a manufacturing step 17 of the double-gate MOS transistor according to the present invention.

FIG. 20 is a diagram for explaining a manufacturing step 17 of a double-gate MOS transistor according to the present invention.

Next, as shown in FIG. 18, mask material, such as a resist or a silicon oxide film, is formed or laminated on the surface, and a set of openings 206 is formed therein, the set of openings 206 traversing the island-shaped semiconductor crystal layer 100 in the thickness direction thereof and causing only the surfaces of the remaining island-shaped polycrystalline silicon layers 61, 62, 65, 66, 69, and 70 to be exposed. Then, the island-shaped polycrystalline silicon layers 61, 62, 65, 66, 69, and 70 are etched through the openings 206, forming a set of grooves 207 to 212 having depths extending to the insulating film 2, as shown in FIG. 19. Then, the mask material is removed, the remaining silicon oxide films 24 are etched to expose the side surfaces of the source regions 32 and 35 and the mutually contacting drain regions 33 and 34 of the P-type and N-type double-gate MOS transistor structures. Furthermore, the grooves 207 to 212 are filling with a material that is suitable for forming contacts, such as metal, whereby the source electrode 21 of the P-type double-gate MOS transistor structure, the output electrode 22 of the double-gate CMOS structure, and the source electrode 23 of the N-type double-gate MOS transistor structure are formed. As described above, the positions of the respective electrodes can be substantially determined by a single lithography process shown in FIG. 7. Alternatively, the respective electrodes may be separately formed in a single flattening process after sequentially filling in materials for the gate, source, and drain electrodes. When etching the island-shaped polycrystalline silicon layers through the openings, electrode materials previously deposited are etched to expose the surfaces of the island-shaped polycrystalline silicon layers to the openings. When the electrode materials are sequentially filled in as described above, the electrode materials are deposited in layers on the surface. However, these electrode materials can be removed from the surface by a flattening process, and the electrodes are separately formed simultaneously with the respective electrode materials filling the respective grooves.

When common gate electrode material is used for the P-type and N-type double-gate MOS transistor structures, the processes shown in FIGS. 12 to 18 can be integrated into a single process. This allows reducing the number of processes.

Figure 21:
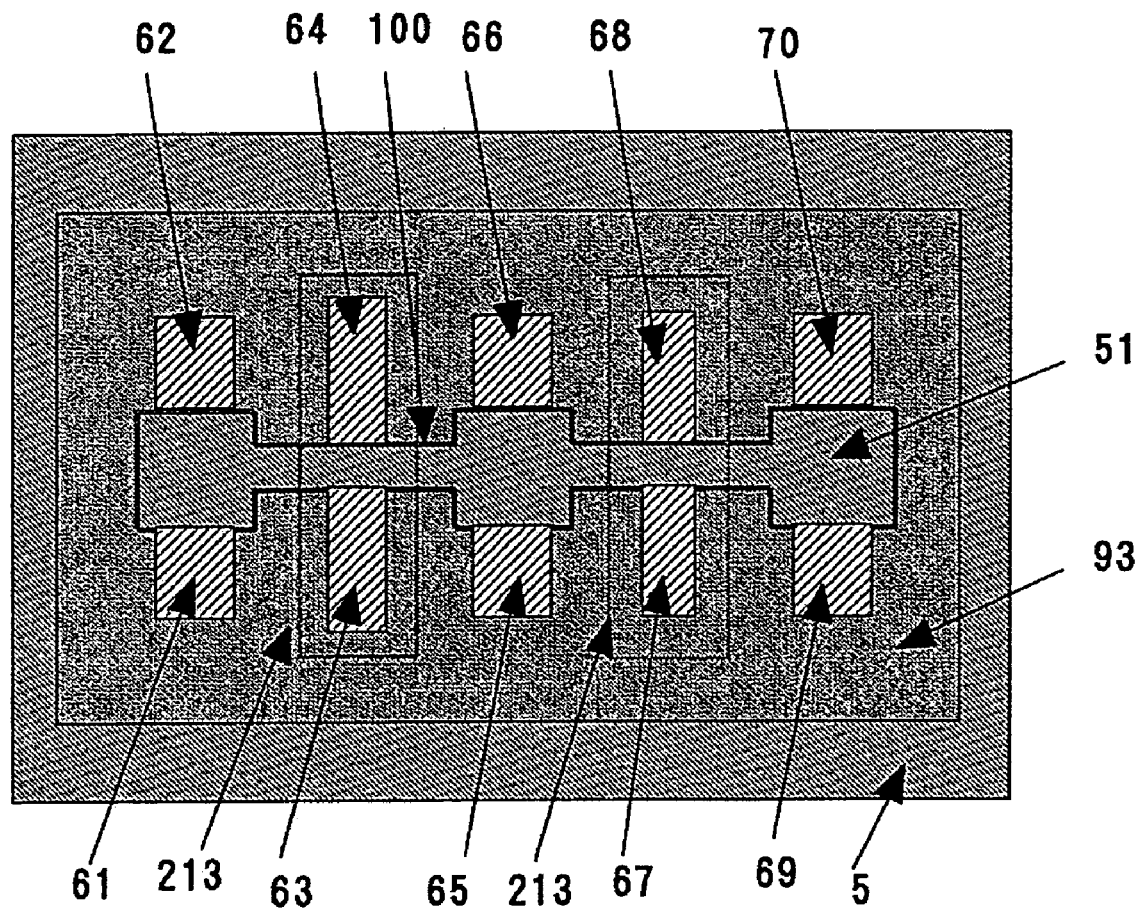
FIG. 21 is a diagram for explaining a manufacturing step 18 of the double-gate MOS transistor according to the present invention.

FIG. 21 is a diagram for explaining a manufacturing step 18 of the double-gate MOS transistor according to the present invention.

Figure 22:
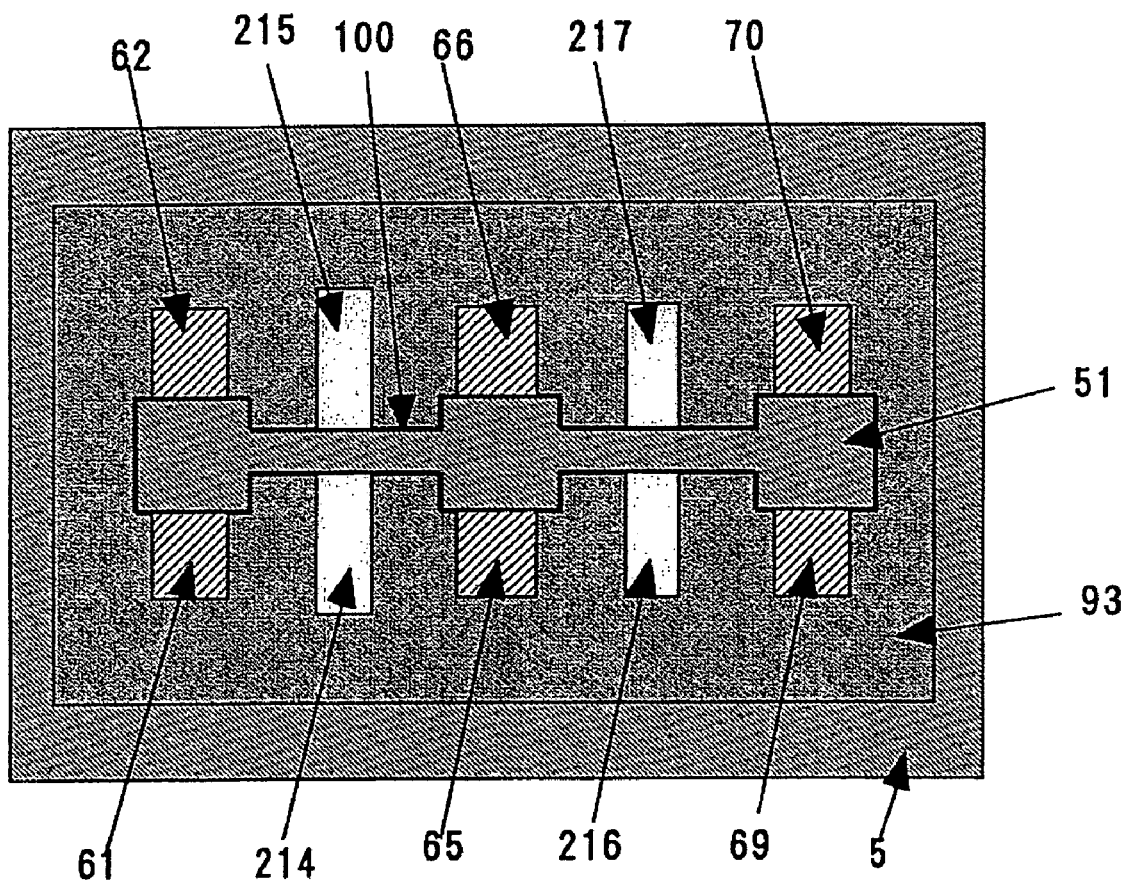
FIG. 22 is a diagram for explaining a manufacturing step 19 of the double-gate MOS transistor according to the present invention.

FIG. 22 is a diagram for explaining a manufacturing step 19 of the double-gate MOS transistor according to the present invention.

Figure 23:
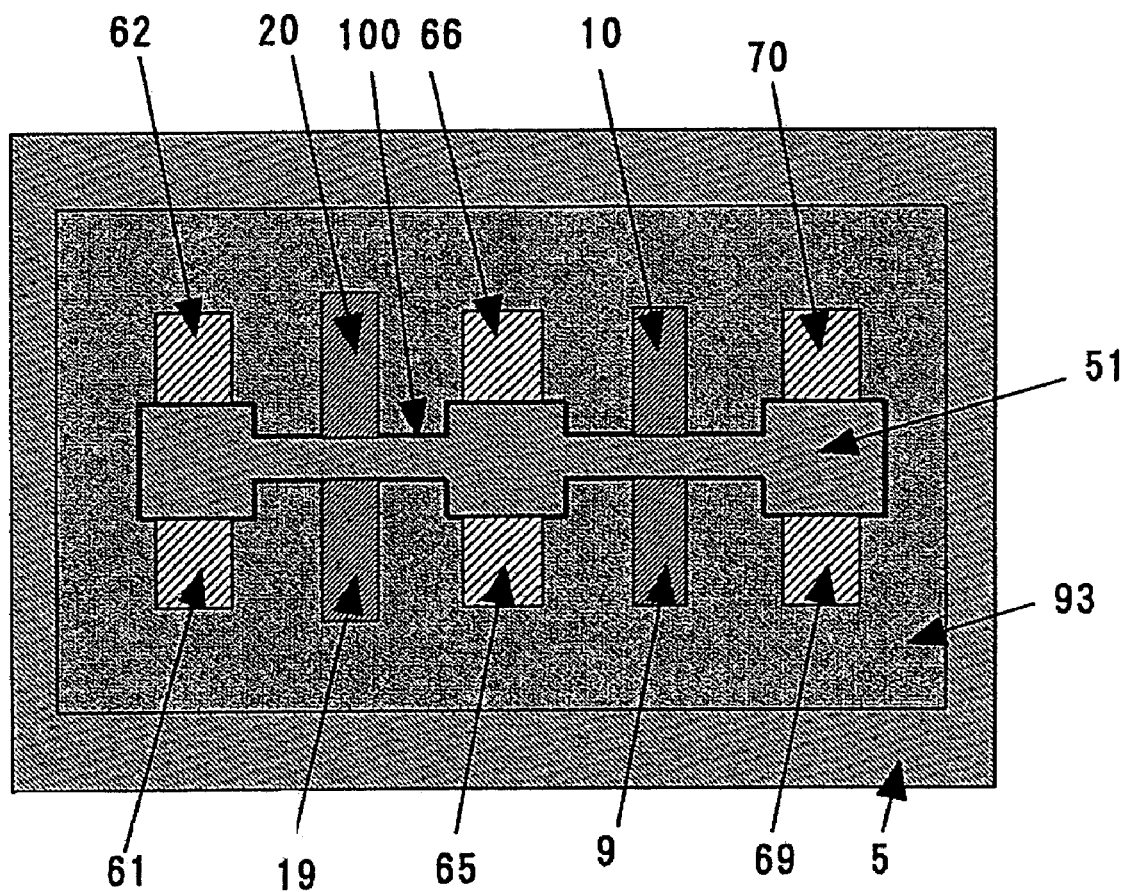
FIG. 23 is a diagram for explaining a manufacturing step 20 of the double-gate MOS transistor according to the present invention.

FIG. 23 is a diagram for explaining a manufacturing step 20 of the double-gate MOS transistor according to the present invention.

Figure 24:
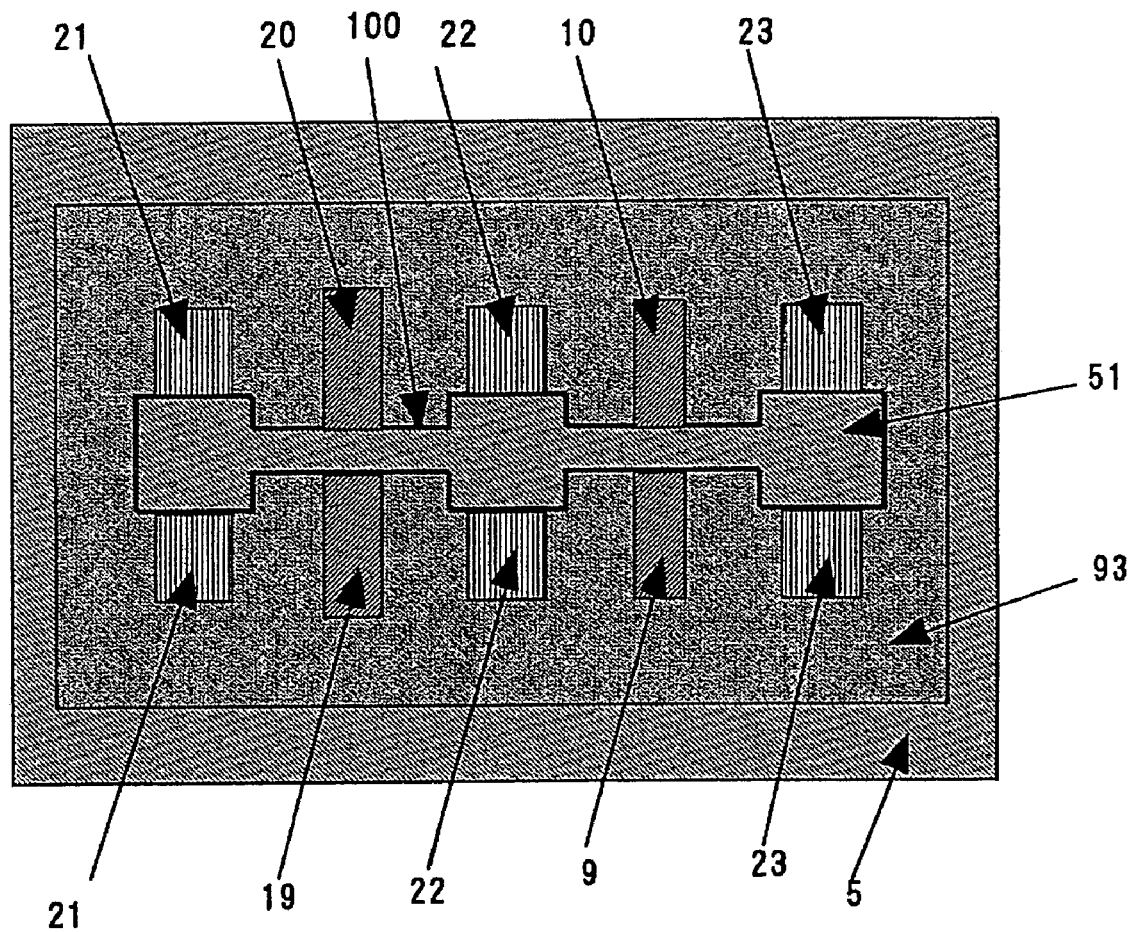
FIG. 24 is a diagram for explaining a manufacturing step 21 of the double-gate MOS transistor according to the present invention.

FIG. 24 is a diagram for explaining a manufacturing step 21 of the double-gate MOS transistor according to the present invention.

As shown in FIG. 21, mask material, such as a resist or a silicon oxide film, is formed or laminated on the surface, and a set of openings 213 is formed therein, the openings 213 traversing the island-shaped semiconductor crystal layer 100 in the thickness direction thereof and causing only the surfaces of the island-shaped polycrystalline silicon layers 63, 64, 67, and 68 to be exposed. Then, the island-shaped polycrystalline silicon layers 63, 64, 67, and 68 70 are etched through the openings 213, forming a set of grooves 214 to 217 having depths extending to the insulating film 2, as shown in FIG. 22. Then, the mask material is removed, the remaining silicon oxide films 24 are etched to expose the side surfaces of the channel regions 30 and 31 of the P-type and N-type double-gate MOS transistor structures. Furthermore, the side surfaces of the semiconductor crystal of the channel regions 30 and 31 are etched so that the thicknesses of the respective channels become a predetermined thickness. Then, gate oxide films are formed. Depending on cases, the gate oxide films may be formed without performing the etching process. Alternatively, the remaining silicon oxide films 24 may be used as the gate oxide films. Then, the grooves 214 to 217 are filled with electrode material, such as the first metal or silicide, with which the threshold voltage of the P-type double-gate MOS transistor structure becomes a predetermined value, a flattening process is performed, and then gate electrodes 19, 20, 9, and 10 are formed, as shown in FIG. 23. Subsequent processes are the same as those described earlier, whereby an arrangement shown in FIG. 24 is formed.

In the manufacturing stepes described above, when forming gate electrodes or drain electrodes and source electrodes by filling grooves with electrode materials, in order to achieve a predetermined value of threshold voltage, the grooves may be first partially filled so as to cover at least the side surfaces of the island-shaped semiconductor crystal layer and then with metal having a different work function and a smaller resistance, such as aluminum or copper, forming the electrodes by flattening these materials. Accordingly, the resistance of wiring in the grooves can be further reduced, or the area of the horizontal section of wiring can be reduced. This serves to reduce the planar area of the circuitry as a whole, allowing further increase in the speed of circuit operation. This effect is enhanced by filling the grooves with a material having a low dielectric constant.

Furthermore, the source and drain electrodes of the P-type double-gate MOS transistor structure and the source and drain electrodes of the N-type double-gate MOS transistor structure may be composed of materials having different work functions. For this purpose, as an alternative to the openings 206 shown in FIG. 18, the surfaces of the island-shaped polycrystalline silicon layers 61 and 62 are exposed, and the surfaces of the left half on the P-type side of the island-shaped polycrystalline silicon layers 65 and 66 are exposed simultaneously, and these sections are etched. Furthermore, the exposed silicon oxide films 24 are removed. Then, electrode material having a desired work function is filled in. Then, the surfaces of the island-shaped polycrystalline silicon layers 69 and 70 are exposed, and the surfaces of the remaining right half on the N-type side of the island-shaped polycrystalline silicon layers 65 and 66 are exposed, and these sections are etched. Furthermore, the exposed silicon oxide films 24 are removed, and a material having a desired work function is filled in.

In this manner, the double-gate CMOS structures according to the present invention, shown in FIGS. 1 and 2, in which electrodes are formed by self-alignment and all the electrodes are formed on side surfaces, are obtained. As well as CMOS structures, similar processes can be applied to only the P-type or N-type double-gate MOS transistor structure formed in the grove 6, by omitting processes for forming the double-gate MOS transistor structure of the other type, forming electrodes by self-alignment and forming all the electrodes on side surfaces. This serves to reduce the planar area for lead-out electrodes. Furthermore, advantageously, wiring in the first layer in the groove can be implemented by metal or silicide having a low resistance.

Figure 25:
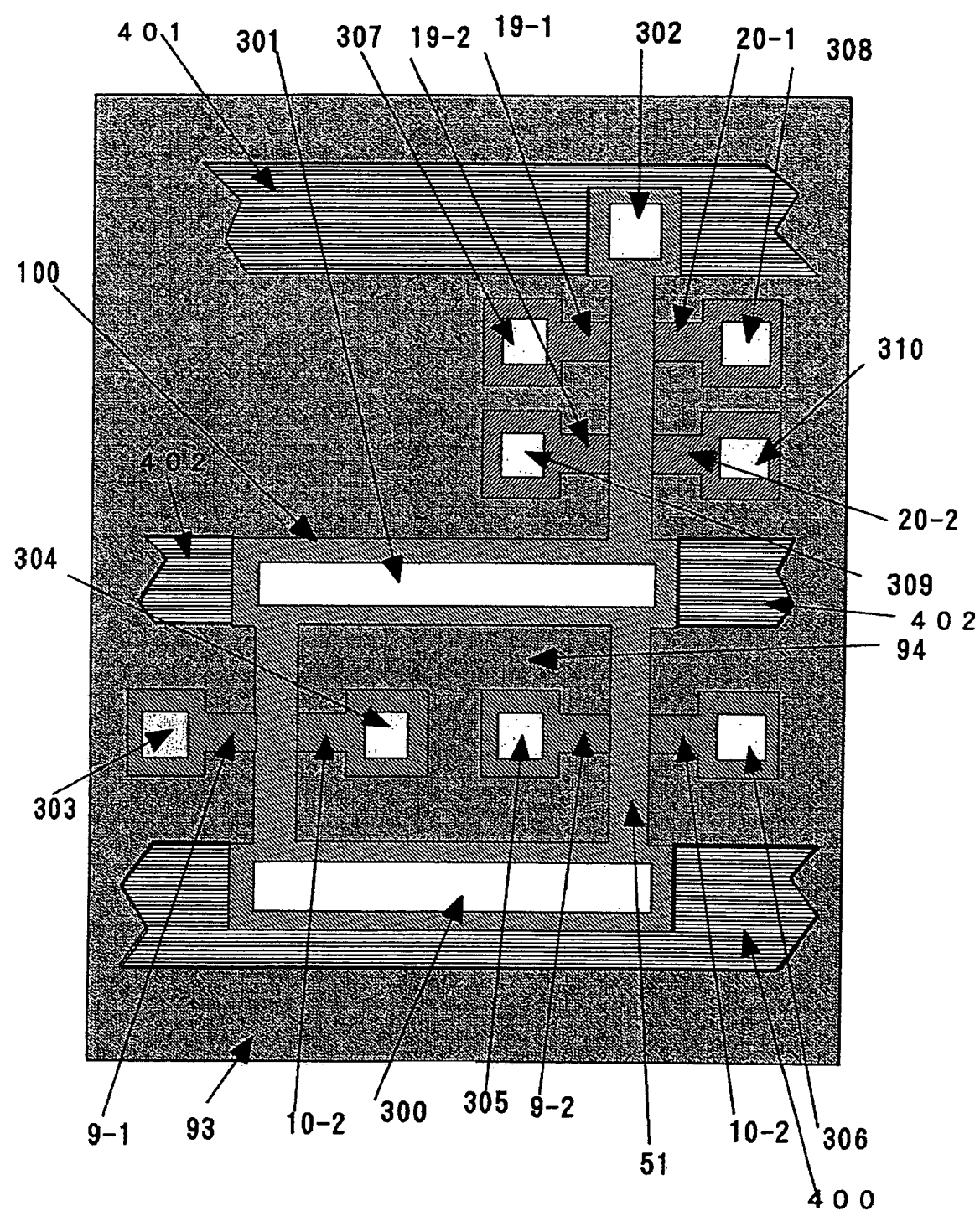
FIG. 25 is a diagram showing an example planar pattern of a case where a double-gate CMOS structure according to the present invention is applied to a two-input NOR gate circuit.

FIG. 25 is a diagram showing an example planar pattern of a case where a double-gate CMOS structure according to the present invention is applied to a two-input NOR gate circuit. In FIG. 25, regions outside the groove are omitted. FIG. 25 shows a case where the groove is formed in the island-shaped semiconductor crystal layer. Two pairs of gate electrodes 19-1 and 20-1 and 19-2 and 20-2 allow operation of two P-type double-gate MOS transistors connected in series, and two pairs of gate electrodes 9-1 and 10-1 and 9-2 and 10-2 allow operation of two N-type double-gate MOS transistors connected in parallel. 300 to 306 denote openings for providing contact (contact holes) through which desired wiring among the electrodes are formed in the second layer. 400 to 402 respectively denote a ground line, a power supply line, and an output electrode line. The planar area of contact holes 303 to 310 needed not be so large as in the case of semiconductors since it suffices to provide electrical contact with metal or silicide. Furthermore, instead of forming a common semiconductor layer as the drain regions and source regions of the N-type double-gate MOS transistor structures connected in parallel, electrode regions may be respectively provided on side surfaces, connecting them using metal or the like. In that case, the area of contact holes needed for wiring in the second layer can be reduced.

Figure 26:
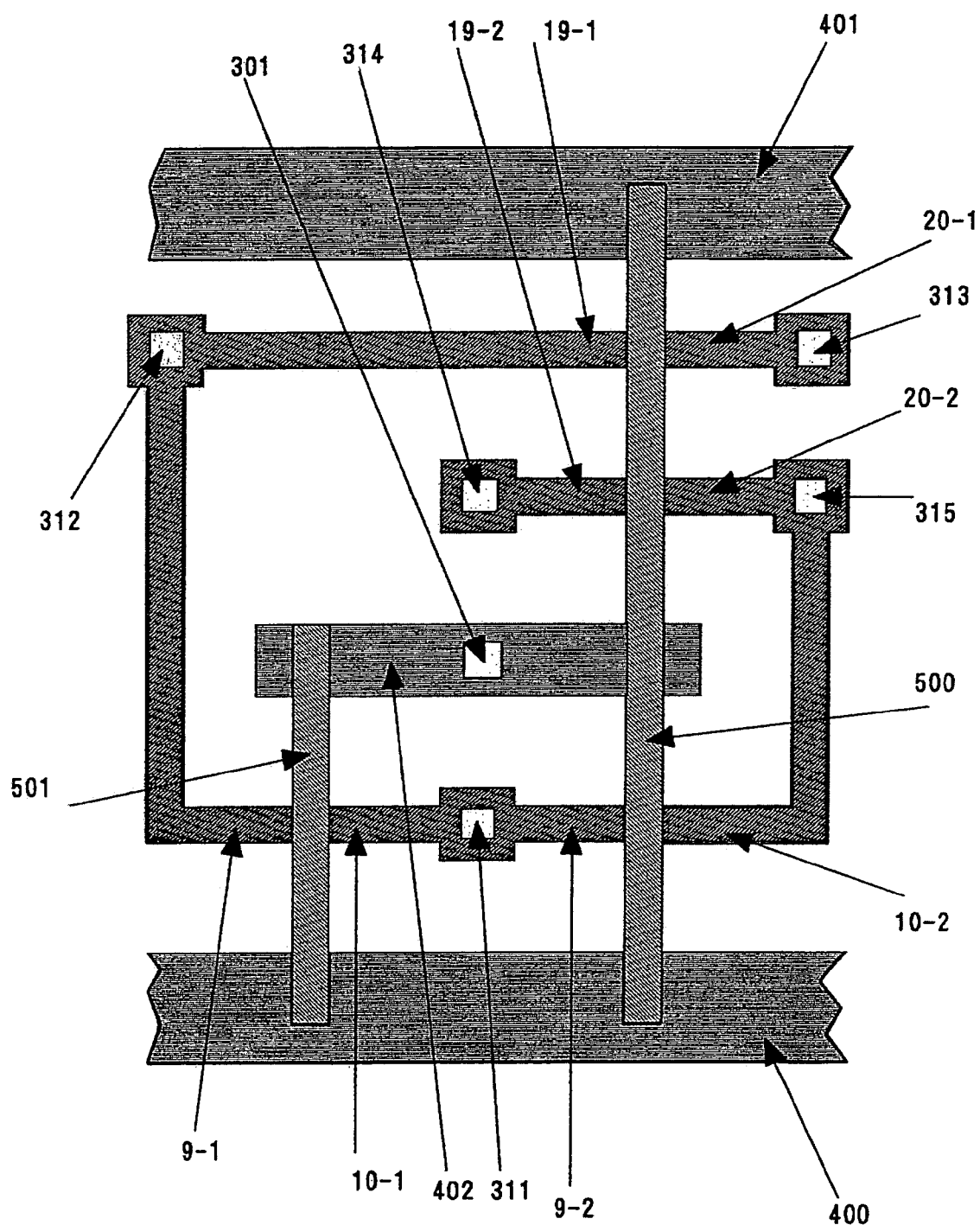
FIG. 26 shows the planar pattern (groove is not shown either) of a two-input NOR gate structure according to the present invention.

FIG. 26 shows the planar pattern (groove is not shown either) of a two-input NOR gate structure according to the present invention. A double-gate CMOS structure 500 and an N-type double-gate MOS transistor structure according to the present invention are used. An output electrode of the former and a drain electrode of the latter are connected via a wiring layer 402 in a groove, and the source electrode of the N-type transistor structure of the former and the source electrode of the latter are connected via a wiring layer 400, whereby a NOR gate structure equivalent to that shown in FIG. 25 is implemented. Furthermore, in the groove, the gate electrode 19-1 and the gate electrode 9-1 are connected to form a first input of the CMOS NOR gate, and the gate electrode 10-2 and the gate electrode 20-2 are connected to form a second input of the CMOS NOR gate. Furthermore, the gate electrodes 10-1 and 9-2 are connected to receive input of signals for controlling threshold voltages of the two N-type double-gate MOS transistors. Furthermore, the ground line (GND) 400 and the power supply line (VCC) 401 may be formed in the groove. The output is lead out in the second layer via the contact hole 301. Furthermore, the two inputs are lead out from contact holes 312 and 315. At the same time, the gate electrodes 20-1 and 19-2 are connected to the gate electrodes 19-1 and 20-2 through the contact holes 313 and 314, whereby the two-input NOR CMOS circuit is formed.

Although the embodiments have been described in the context of cases where a single island-shaped semiconductor crystal layer is provided in a single groove, a set of island-shaped semiconductor crystal layers each having a predetermined height and length and a predetermined shape of horizontal section may be provided, and one or more double-gate MOS transistor structures or double-gate CMOS structures may be provided for each of the island-shaped semiconductor crystal layers, forming a set of double-gate MOS transistor structures or a set of double-gate CMOS structures (including a case where a set of double-gate MOS transistor structures is included in the same groove). A desired circuit function can be achieved by connecting these structures as appropriate. For convenience, a case where structures are provided in a single groove is also referred to as a set of structures.

Thus the present invention possesses a number of advantages or purposes, and there is no requirement that every claim directed to that invention be limited to encompass all of them.

The disclosure of Japanese Patent Application No. 2004-113707 filed on Apr. 8, 2004 including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A double-gate MOS transistor comprising:
   an insulating layer;
   a substrate; and
   a semiconductor crystal layer,
   wherein the insulating layer is provided between the substrate and the semiconductor crystal layer,
   wherein a part of said semiconductor crystal layer includes, at least, a source region, a channel region, and a drain region,
   wherein a groove in said semiconductor crystal layer extends to said insulating layer,
   wherein said groove surrounds and isolates said part of said semiconductor crystal layer from a part other than said part of said semiconductor crystal layer, thereby defining an island-shaped region,
   wherein gate electrodes are in contact with side surfaces of said channel region,
   wherein gate insulation films are formed on both sides of said channel region forming said part of said groove, and
   wherein electrodes of said source region and said drain region are formed in said groove so as to be in contact with a side surface of said island-shaped region.

2. The double-gate MOS transistor of claim 1, wherein a material of said channel region and a material of said gate electrode have a same work function.

3. A method of manufacturing the double-gate MOS transistor of claim 1 comprising the steps of:
   forming said insulating layer on said substrate;
   forming said semiconductor crystal layer on said insulating layer;
   forming an etching mask on a surface of said semiconductor crystal layer;
   providing at least one pair of heavily doped impurity regions in said semiconductor crystal layer, said pair of heavily doped impurity regions including a first heavily doped impurity region and a second heavily doped impurity region separated from said first heavily doped impurity region by a predetermined distance by a semiconductor region, said pair of heavily doped impurity regions extending from said etching mask to said insulating layer; and
   forming said groove, said groove exposing side surfaces of said semiconductor crystal layer.

4. The method of manufacturing a double-gate MOS transistor of claim 3, wherein the step of forming said etching mask comprises:
   forming a silicon oxide film between said semiconductor crystal layer and a silicon nitride film.

5. The method of manufacturing a double-gate MOS transistor of claim 3, further comprising:
   forming oxide films on said side surfaces of said semiconductor crystal layer;
   filling said groove with polycrystalline silicon; and
   flattening said polycrystalline silicon.

6. The double-gate MOS transistor according to claim 1, wherein gate electrodes, separated from each other and sandwiching said channel region, are formed in said groove.

7. A double-gate MOS transistor, comprising:
   a substrate;
   an insulating layer; and
   a semiconductor crystal layer,
   wherein the substrate, the insulating layer, and the semiconductor crystal layer are formed in that order,
   wherein a part of said semiconductor crystal layer includes, at least, a source region, a channel region, and a drain region,
   a first groove extending to the insulating layer formed in the semiconductor crystal layer while leaving an island-shaped region which includes said part of said semiconductor crystal layer,
   the first groove surrounding and isolating the island-shaped region from a part of the semiconductor crystal layer other than the island-shaped region,
   the island-shaped region including a predetermined length and height and a horizontal section having a predetermined shape,
   the island-shaped region including at least a source region, a channel region and a drain region formed therein in that order, each of which has both side surfaces forming a part of said first groove and facing toward the first groove,
   a source electrode and a drain electrode provided respectively in contact with the side surfaces of the source region and the drain region,
   a first gate electrode provided in contact with one of the side surfaces of the channel region through a first gate oxide film, and
   a second gate electrode provided in contact with the other side surface of the channel region through a second gate oxide film so that the channel region is sandwiched by the first and the second gate electrodes.

8. The double-gate MOS transistor device, comprising:
   a plurality of the double-gate MOS transistors according to claim 7 provided in a second groove which comprises the first grooves.

9. The double-gate MOS transistor device according to claim 8, wherein the plurality of the double-gate MOS transistors comprises only P-type double-gate MOS transistors or only N-type double-gate MOS transistors.

10. The double-gate MOS transistors device according to claim 8, wherein the plurality of the double-gate MOS transistors comprises a plurality of sets of a P-type double-gate MOS transistor and a N-type double-gate MOS transistor.

11. The double-gate MOS transistor device according to claim 10, wherein the gate electrodes of the P-type double-gate MOS transistor and the gate electrodes of the N-type double-gate MOS transistor are made of material having the same work function.

12. The double-gate MOS transistor according to claim 7, wherein at least a wiring connecting one of the electrodes to another is provided in the groove.

13. The double-gate MOS transistor according to claim 7, wherein the groove is filled with an insulating material or insulating materials.

14. A double-gate CMOS transistor, comprising:
an insulating layer;
a substrate; and
a semiconductor crystal layer,
wherein the insulating layer is provided between the substrate and the semiconductor crystal layer,
a P-type double-gate MOS transistor having a source region, a channel region and a drain region, which are provided in a part of the semiconductor crystal layer and
a N-type double-gate MOS transistor having a source region, a channel region and a drain region, which are provided in said part of said semiconductor crystal layer,
wherein the drain region of the N-type double-gate MOS transistor and the drain region of the P-type double gate MOS transistor are in contact with each other in said part of said semiconductor crystal layer,
a first groove in said semiconductor crystal layer extending to the insulating layer while leaving an island-shaped region which includes said part of said semiconductor crystal layer, so that the first groove surrounds and isolates the island-shaped region from a part of the semiconductor crystal layer other than the island-shaped region,
the island-shaped region including a predetermined length and height and a horizontal section having a predetermined shape,
the layer of the island-shaped region including at least a source region, a channel region and a drain region formed therein in that order, each of which has both side surfaces forming a part of the first groove and facing toward the first groove,
a source electrode and a drain electrode provided respectively in contact with the side surfaces of the source region and the drain region,
the first gate electrode provided in contact with one of the side surfaces of the channel region through the first gate oxide film, and
the second gate electrode provided in contact with the other side surface of the channel region through the second gate oxide film so that the channel region is sandwiched by the first and the second gate electrodes.

15. The double-gate CMOS transistor device, comprising:
a plurality of the double-gate CMOS transistors according to claim 14 provided in a second groove which comprises the first grooves.

16. The double-gate CMOS transistor device according to claim 15, wherein the gate electrodes of the P-type double-gate MOS transistor and the gate electrodes of the N-type double-gate MOS transistor are made of material having the same work function.

17. The double-gate CMOS transistor device according to claim 14, wherein the gate electrodes of the P-type double-gate MOS transistor and the gate electrodes of the N-type double-gate MOS transistor are made of material having the same work function.

18. The double-gate CMOS transistor according to claim 14, wherein at least a wiring connecting one of the electrodes to another is provided in the groove.

19. The double-gate MOS transistor according to claim 14, wherein the groove is filled with an insulating material or insulating materials.

* * * * *